(12) United States Patent
Facchetti

(10) Patent No.: US 9,099,670 B2
(45) Date of Patent: Aug. 4, 2015

(54) LIGHT-EMITTING TRANSISTORS WITH IMPROVED PERFORMANCE

(71) Applicant: Polyera Corporation, Skokie, IL (US)

(72) Inventor: Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 35 days.

(21) Appl. No.: 13/843,910

(22) Filed: Mar. 15, 2013

(65) Prior Publication Data

US 2014/0054613 A1 Feb. 27, 2014

Related U.S. Application Data

(60) Provisional application No. 61/693,288, filed on Aug. 25, 2012, provisional application No. 61/701,760, filed on Sep. 17, 2012.

(51) Int. Cl.
*H01L 33/00* (2010.01)
*H01L 51/52* (2006.01)
*H01L 51/00* (2006.01)

(52) U.S. Cl.
CPC ........ *H01L 51/5203* (2013.01); *H01L 33/0041* (2013.01); *H01L 51/5296* (2013.01); *H01L 51/0061* (2013.01)

(58) Field of Classification Search
CPC ............ H01L 51/5203; H01L 51/5296; H01L 33/0041
USPC .............................. 257/79, E51.018; 438/364
See application file for complete search history.

(56) References Cited

U.S. PATENT DOCUMENTS

| | | | |
|---|---|---|---|
| 2008/0142789 A1 | 6/2008 | Suganuma | 257/40 |
| 2009/0140955 A1 | 6/2009 | Nakamura et al. | 345/76 |
| 2009/0315043 A1* | 12/2009 | Nakamura et al. | 257/88 |
| 2010/0140599 A1* | 6/2010 | Yano et al. | 257/40 |
| 2012/0280216 A1* | 11/2012 | Sirringhaus et al. | 257/40 |
| 2013/0009209 A1 | 1/2013 | Yamazaki | 257/192 |
| 2014/0054566 A1 | 2/2014 | Facchetti | 257/40 |

FOREIGN PATENT DOCUMENTS

| | | | |
|---|---|---|---|
| JP | 2002164166 | | 6/2002 |
| JP | 2004311221 | | 11/2004 |
| JP | 2011100938 | | 5/2011 |
| JP | 2011100938 A | * | 5/2011 |
| WO | 2004/086526 | | 10/2004 |
| WO | 2007/010925 | | 1/2007 |

OTHER PUBLICATIONS

English translation of JP-2011-100938.*
Rost et al: "Light-emitting ambipolar organic heterostructure field-effect transistor", *Synthetic Metals*, 146(3): 237-241 (2004).
Rost et al: "Ambipolar light-emitting organic field-effect transistor", *Appl. Phys. Lett.*, 85(9): 1613-1615 (2004).

* cited by examiner

*Primary Examiner* — Cheung Lee
*Assistant Examiner* — Stephen Bradley
(74) *Attorney, Agent, or Firm* — Karen K. Chan

(57) ABSTRACT

Disclosed are light-emitting transistors having novel structures that can lead to enhanced device brightness, specifically, via incorporation of additional electrically insulating components that can favor charge localization and in turn, carrier recombination and exciton formation.

10 Claims, 15 Drawing Sheets a.

b.

a.

b.

c.

d.

a.

b.

a.

b.

c.

d.

a.

b.

c.

d.

a.

b.

c.

d.

a.

b.

c.

d.

a.

b.

a.

b.

a.

b.

a.

b.

a.

b.

c.

d.

US 9,099,670 B2

LIGHT-EMITTING TRANSISTORS WITH IMPROVED PERFORMANCE

CROSS-REFERENCE TO RELATED APPLICATIONS

This application claims priority to and the benefit of U.S. Provisional Patent Application Ser. No. 61/693,288, filed on Aug. 25, 2012, and U.S. Provisional Patent Application Ser. No. 61/701,760, filed on Sep. 17, 2012, the disclosure of each of which is incorporated by reference herein in its entirety.

BACKGROUND

The potential of organic semiconductor-based devices for light generation is demonstrated by the commercialization of display technologies based on organic light-emitting diodes (OLEDs). Nonetheless, device complexity, efficient integration between frontplane and backplane components as well as exciton quenching and photon loss processes still limit OLED efficiency and brightness.

Organic light-emitting transistor (OLET) is a recently developed optoelectronic device that combines the switching mechanism of a thin-film transistor and an electroluminescent device. While charge transport occurs perpendicular to the organic layers in an OLED, the majority of the current flows horizontally through the semiconducting layers in an OLET. As a result, light in an OLET is emitted as a stripe along the emissive layer, rather than uniformly through the electrode areas as in conventional OLEDs. The planar transport geometry of OLETs helps suppress deleterious photon losses and exciton quenching mechanisms inherent in the OLED architecture. Accordingly, the same organic electroluminescent light-emitting material has been shown to achieve much higher external quantum efficiency (EQE) in an OLET than in an equivalent OLED.

In particular, a trilayer heterostructure OLET has been reported with a maximum EQE of about 5%. The reported trilayer heterostructure OLET includes, from bottom to top, a transparent substrate, a gate electrode, a gate dielectric, an active layer consisting of the superposition of three organic layers, and source and drain electrodes on top of the active layer. The trilayer active layer includes a light-emitting host-guest matrix sandwiched between an electron-transporting (n-type) semiconductor and a hole-transporting (p-type) semiconductor. However, because only a small portion of the current is converted into excitons, one area of weakness for this device structure is the limited brightness.

Accordingly, there is a need in the art to develop new OLET device structures that can provide improved brightness.

SUMMARY

In light of the foregoing, the present teachings provide light-emitting transistors having novel structures that can lead to enhanced device brightness, specifically, via incorporation of one or more electrically insulating elements between a charge injection electrode (for carriers of a particular charge) and a charge transport layer (for carriers of the opposite charge), to favor charge localization and in turn carrier recombination, and exciton formation.

The present teachings also relate to methods of fabricating the OLETs described herein. For example, one or more electrically insulating elements can be incorporated within the channel layer of the present OLETs by a process selected from the group consisting of thermal evaporation, sputtering, atomic layer deposition, chemical vapor deposition, solution processing, spin-coating, slot die coating, and printing.

The foregoing as well as other features and advantages of the present teachings will be more fully understood from the following figures, description, examples, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

As shown in FIG. 16a, at least one of the electrically insulating elements can be positioned in contact with one of the hole electrode and the electron electrode.

As shown in FIG. 17a, at least one of the electrically insulating elements can be positioned in contact with one of the hole electrode and the electron electrode.

FIG. 18a shows a bottom-gate OLET with nonplanar hole electrode and electron electrode. FIG. 18b shows a bottom-gate OLET with planar hole electrode and electron electrode. FIG. 18c shows a top-gate OLET with planar hole electrode and electron electrode. FIG. 18d shows a top-gate OLET with nonplanar hole electrode and electron electrode.

DETAILED DESCRIPTION

Figure 1:
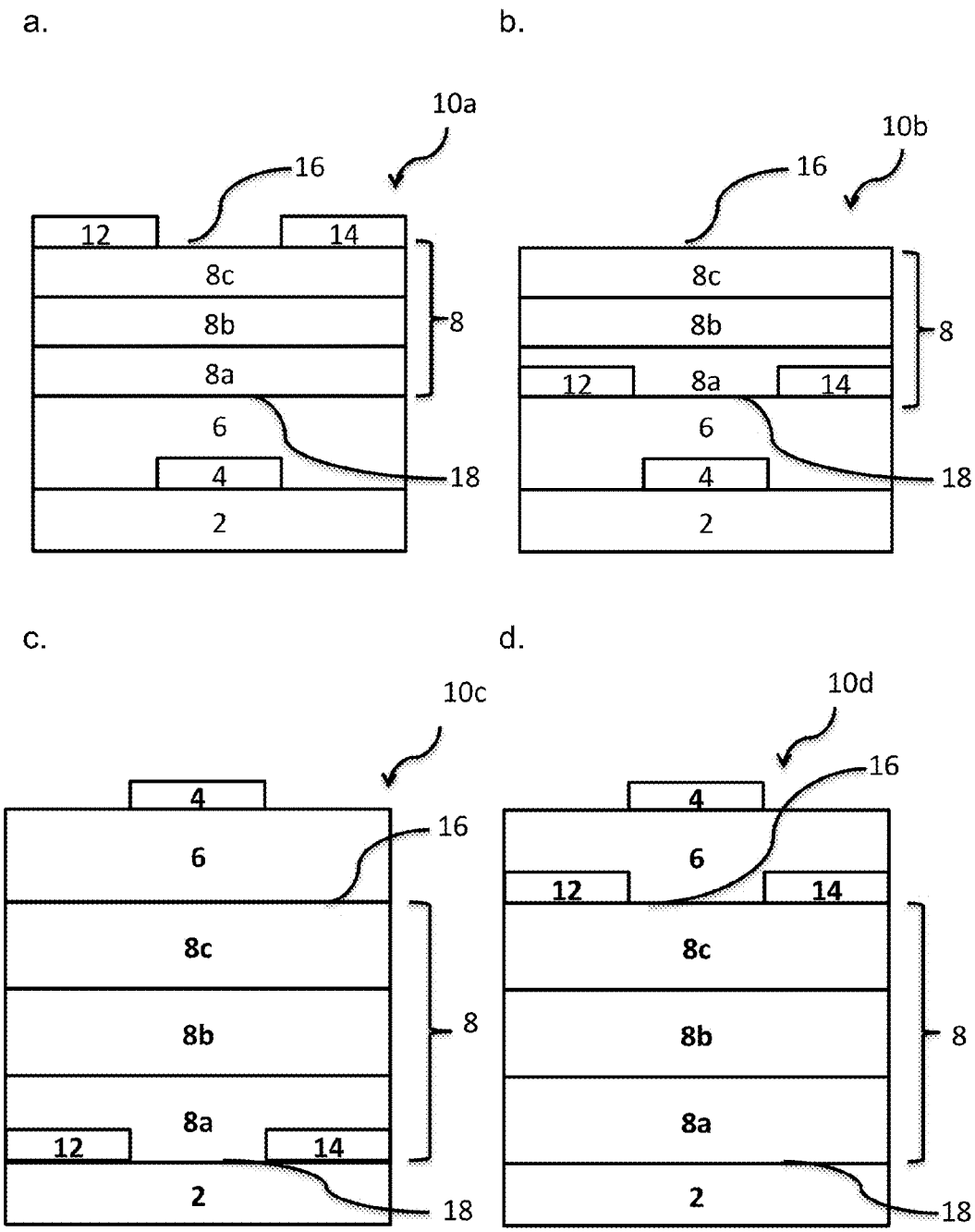
FIG. 1 shows a cross section view of (a) a bottom-gate top-contact light-emitting transistor 10a, (b) a bottom-gate bottom-contact light-emitting transistor 10b, (c) a top-gate bottom-contact light-emitting transistor 10c, and (d) a top-gate top-contact light-emitting transistor 10d, wherein the channel layer 8 comprises a trilayer heterostructure including a first charge transport sublayer 8a, a second charge transport sublayer 8c, and an emissive sublayer 8b sandwiched therebetween.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material," "p-type semiconductor" or a "p-type OSC" refers to a semiconductor material or a semiconducting compound having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10. In certain embodiments, a p-type OSC can be characterized by a highest occupied molecular orbital (HOMO)

energy that is higher than or about −6.4 V, preferably higher than or about −6.2 V, and more preferably, higher than or about −6.0 V.

As used herein, an "n-type semiconductor material," an "n-type semiconductor" or an "n-type OSC" refers to a semiconductor material or a semiconducting compound having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10. In certain embodiments, an n-type OSC can be characterized by a lowest unoccupied molecular orbital (LUMO) energy that is lower than or about −3.2 V, preferably lower than or about −3.6 V, and more preferably, lower than or about −4.0 V.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which limited depends on the device architecture, can be measured using a field-effect device or space-charge current measurements.

As used herein, "solution-processable" refers to compounds, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Referring to the drawings wherein like reference numerals represent like elements throughout the various drawing figures, a conventional organic light-emitting transistor (OLET) typically has a stacked structure that includes a substrate 2, a gate electrode 4, a gate insulating (dielectric) layer 6 coupled to the gate electrode, an active channel layer 8, and a hole electrode 12 and an electron electrode 14 both in contact with the active channel layer. The hole electrode 12 and the electron electrode 14 are positioned on the same plane and are spaced apart at a distance that defines the length of the channel region (L). The active channel layer can include one or more organic semiconductor materials that individually or in combination can perform the function of electron transport, hole transport, and light emission. For example, in the trilayer heterostructure OLET shown in FIG. 1, the active channel layer 8 can include sublayers 8a and 8c which, respectively, are adapted to allow transport of charge carriers of opposite types, and sublayer 8b which is adapted to facilitate recombination of holes and electrons to generate light.

The hole electrode, the electron electrode, and the gate electrode can have different arrangements in relation to the channel layer. FIG. 1a shows a bottom-gate top-contact OLET 10a, wherein the gate electrode 4 is positioned below the channel layer 8 (in contact with the substrate 2), and the hole electrode 12 and the electron electrode 14 are positioned on top of the channel layer 8 (in contact with a first (top) side 16 of the channel layer 8). FIG. 1b shows a bottom-gate bottom-contact OLET 10b, wherein the gate electrode 4 is positioned below the channel layer 8 (in contact with the substrate 2), and the hole electrode 12 and the electron electrode 14 are positioned at the interface between the dielectric layer 6 and a second (bottom) side 18 of the channel layer 8. FIG. 1c shows a top-gate bottom-contact OLET 10c, wherein the gate electrode 4 is positioned on top of the channel layer 8, and the hole electrode 12 and the electron electrode 14 are positioned at the interface between the substrate 2 and a second (bottom) side 18 of the channel layer 8. FIG. 1d shows a top-gate top-contact OLET 10d, wherein the gate electrode 4 is positioned on top of the channel layer 8, and the hole electrode 12 and the electron electrode 14 are positioned at the interface between the dielectric layer 6 and a first (top) side 16 of the channel layer 8.

With continued reference to FIG. 1, conventional OLETs have coplanar hole electrode 12 and electron electrode 14 through which positive charge carriers (holes) and negative charge carriers (electrons), respectively, are injected into the active channel layer 8. Statistically, only a small percentage of holes and electrons that are injected into the channel layer are converted into excitons to generate light. This is because only the holes from the hole transport sublayer and the electrons from the electron transport sublayer that are electrostatically attracted into the emissive sublayer will recombine to form excitons. Particularly, holes and electrons that are within the channel region between the hole electrode and the electron electrode have a much larger likelihood to recombine to form excitons than holes and electrons that are located in portions of the channel layer lying directly below or above the electrodes.

To enhance localization of charge carriers in the channel region between the hole electrode and the electron electrode, the present teachings relate to novel OLET structures having one or more electrically insulating elements positioned within the channel layer. The one or more electrically insulating elements can be arranged in various ways in relation to each other and in relation to the different sublayers of the channel layer, provided that individually or in combination the electrically insulating element(s) do not extend the entire length of the channel region. The electrically insulating element(s) provide a physical barrier against charge carriers from moving into areas directly below or above the hole electrode and/or the electron electrode, thereby forcing more charge carriers to be localized within the channel region between the hole electrode and the electron electrode. In various embodiments, the electrically insulating elements can be embedded within or otherwise positioned in contact with the emissive sublayer of the channel layer.

Figure 2:
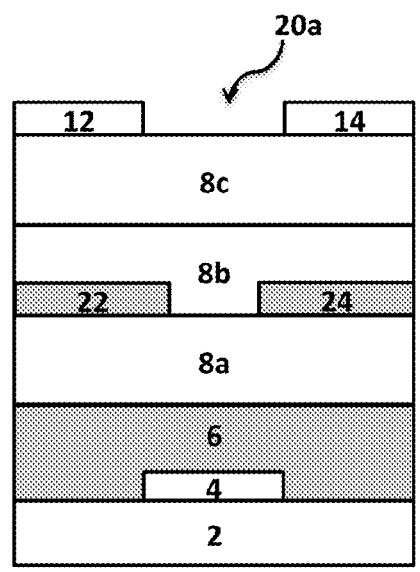
FIG. 2 shows a cross section view of (a) a bottom-gate top-contact light-emitting transistor 20a including electrically insulating elements 22 and 24, wherein the electrically insulating elements 22 and 24 and the hole and electron electrode 12 and 14 are in contact with a different charge transport sublayer; (b) a bottom-gate top-contact light-emitting transistor 20b including electrically insulating elements 22 and 24, wherein the electrically insulating elements 22 and 24 and the hole and electron electrode 12 and 14 are in contact with opposite surfaces of a charge transport sublayer; (c) a top-gate bottom-contact light-emitting transistor 20c including electrically insulating elements 22 and 24, wherein the electrically insulating elements 22 and 24 and the hole and electron electrode 12 and 14 are in contact with opposite surfaces of a charge transport sublayer; and (d) a top-gate bottom-contact light-emitting transistor 20d including electrically insulating elements 22 and 24, wherein the electrically insulating elements 22 and 24 and the hole and electron electrode 12 and 14 are in contact with a different charge transport sublayer.
Figure 2:
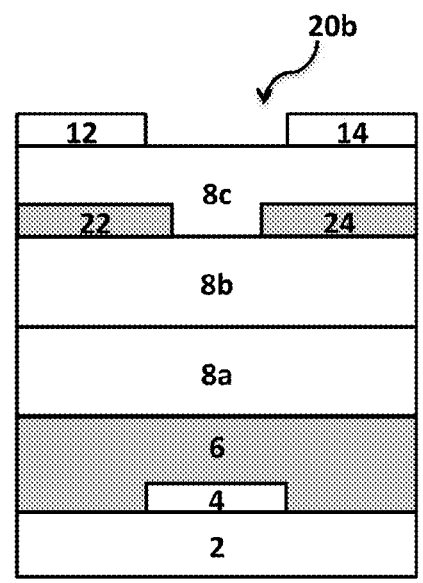
Figure 2:
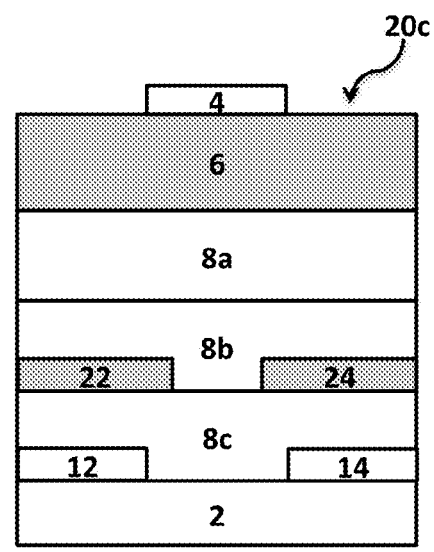
Figure 2:
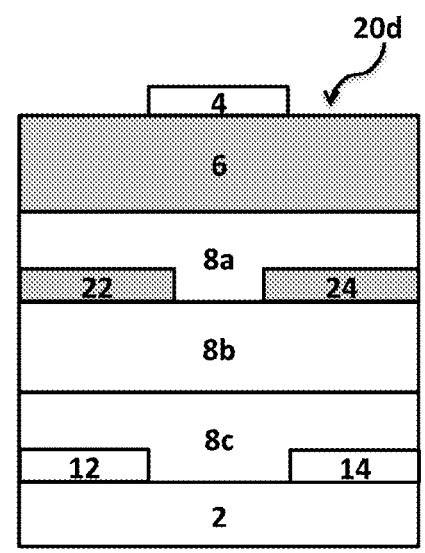

Referring to FIG. 2, an electrically insulating element can be present directly above or below each of the hole electrode and the electron electrode. For example, in a bottom-gate top-contact OLET (20a or 20b) wherein both the hole electrode 12 and the electron electrode 14 are in contact with a first charge transport sublayer 8c, the channel layer can include a first electrically insulating element 22 positioned between the hole electrode 12 and a second charge transport sublayer 8a, and/or a second electrically insulating element 24 positioned between the electron electrode 14 and the second charge transport sublayer 8a. While the first and second electrically insulating elements can be embedded within any of sublayers 8a, 8b, or 8c, for ease of fabrication (e.g., keeping the number of deposition/photolithography/etching steps to a minimum), the first and second electrically insulating elements can be deposited either on top of the charge transport sublayer 8a (FIG. 2a) or on top of the emissive sublayer 8b (FIG. 2b). Likewise, in a top-gate bottom-contact OLET (20c or 20d) wherein both the hole electrode 12 and the electron electrode 14 are deposited on the substrate 2 in contact with a first charge transport sublayer 8c, the channel layer can include a first electrically insulating element 22 positioned between the hole electrode 12 and a second charge transport sublayer 8a, and/or a second electrically insulating element 24 positioned between the electron electrode 14 and the second charge transport sublayer 8a. Again, the first and second electrically insulating elements can be embedded within any of sublayers 8a, 8b, or 8c; however, for ease of fabrication, the first and second electrically insulating elements can be deposited either on top of the charge transport sublayer 8c (FIG. 2c) or on top of the emissive sublayer 8b (FIG. 2d).

In certain embodiments, the present OLETs can have non-planar hole electrode and electron electrode. As understood by those skilled in the art, the hole electrode and the electron electrode can function, respectively, as the source electrode and the drain electrode (or vice versa) depending on the polarity of the gate voltage. Briefly, because the source electrode is typically grounded (0 V), if the gate voltage is −100V and the drain voltage is −80V, then the source electrode is the hole electrode (negatively biased) and the drain electrode is the electron electrode (positively biased). On the other hand, if the gate voltage is +100V, the source electrode is the electron electrode and the drain electrode is the hole electrode. Therefore, the present OLETs also can be described as having non-planar source electrode and drain electrode.

Figure 3:
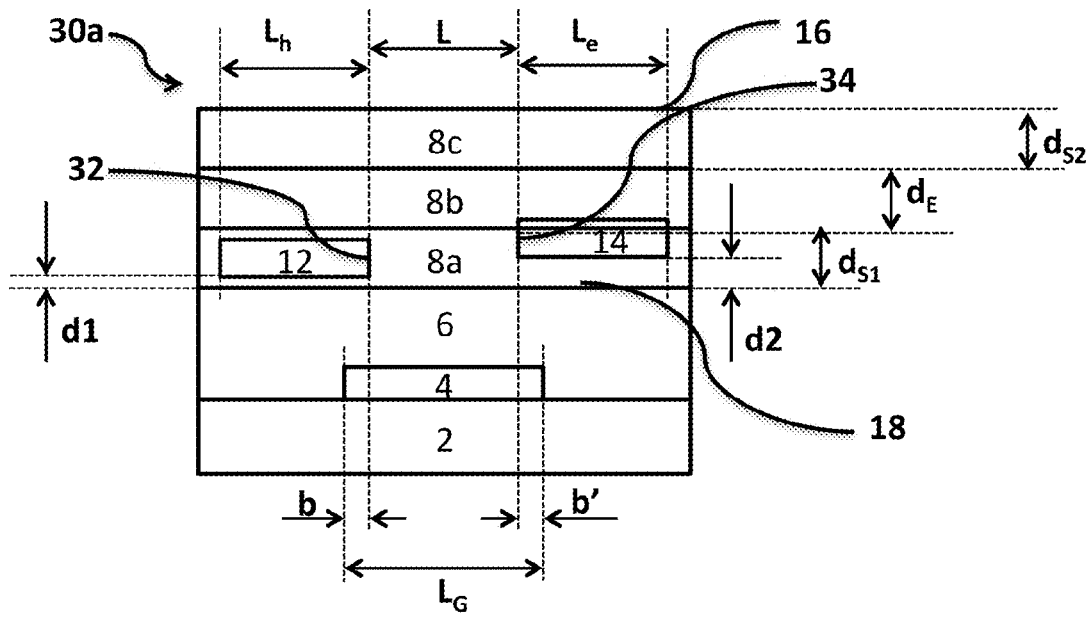
FIG. 3 shows a cross section view of (a) a bottom-gate light-emitting transistor 30a and (b) a top-gate light-emitting transistor 30b according to the present teachings, wherein the source and drain contacts (hole and electron electrodes 12, 14) are offset vertically from each other.
Figure 3:
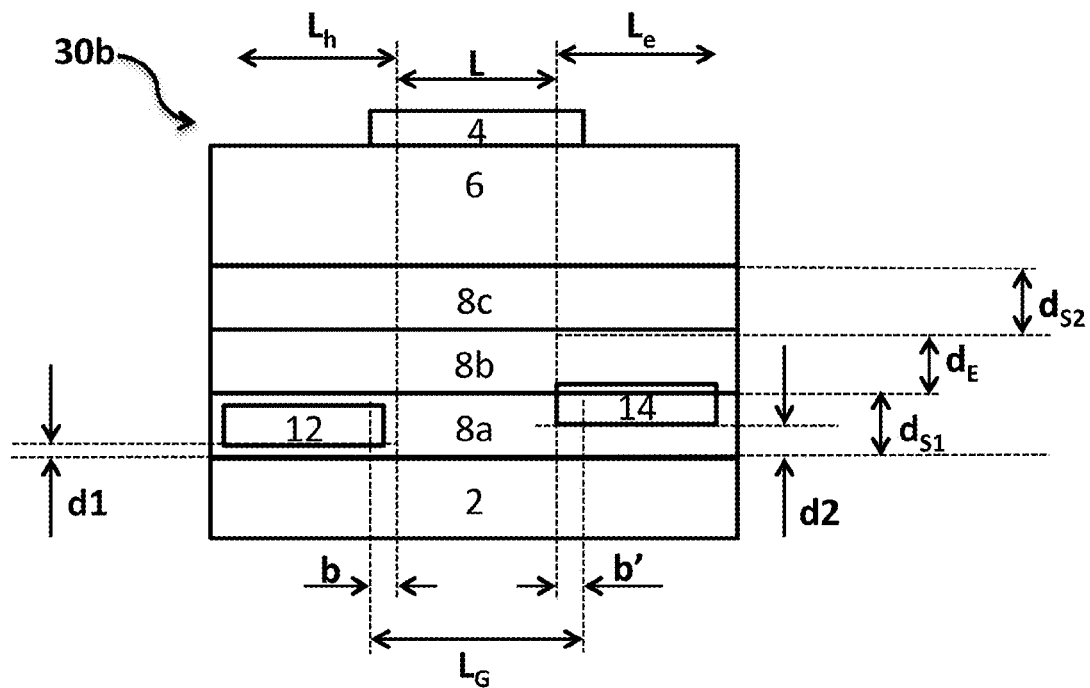
Figure 4:
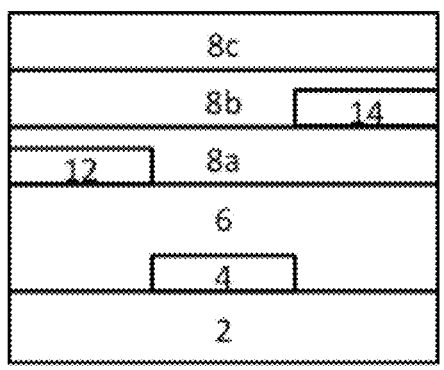
FIG. 4 illustrates different embodiments of OLETs according to the present teachings, wherein the hole electrode 12 is positioned within the hole transport sublayer 8a, and the electron electrode 14 is positioned (a and b) within the emissive sublayer 8b, (c) within the electron transport sublayer 8c, or (d) on top of the channel layer in contact with the electron transport sublayer 8c.
Figure 4:
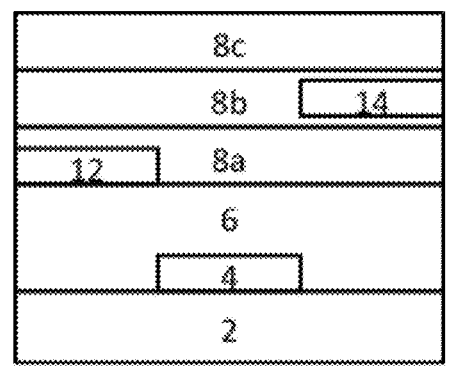
Figure 4:
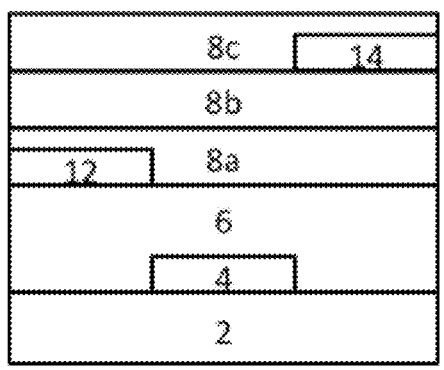
Figure 4:
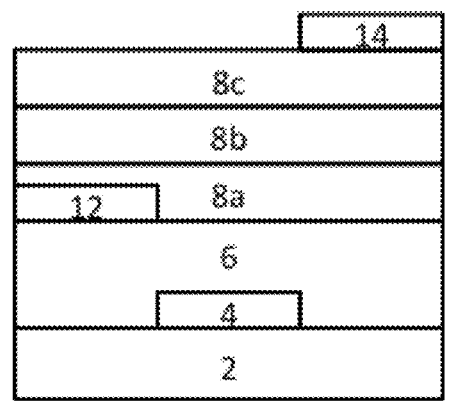
Figure 5:
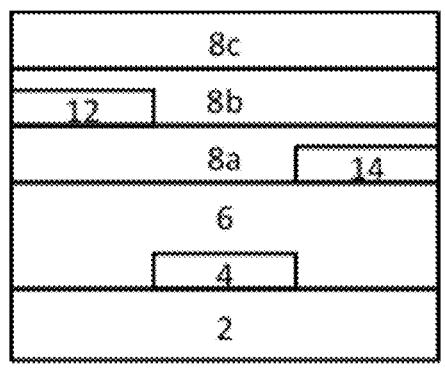
FIG. 5 illustrates different embodiments of OLETs according to the present teachings, wherein the hole electrode 12 is positioned within the emissive sublayer 8b in contact with the hole transport sublayer 8a, and the electron electrode 14 is positioned (a) within the hole transport sublayer 8a, (b) within the emissive sublayer 14 but not in contact with the hole transport sublayer 8a, (c) within the electron transport sublayer 8c, or (d) on top of the channel layer 8.
Figure 5:
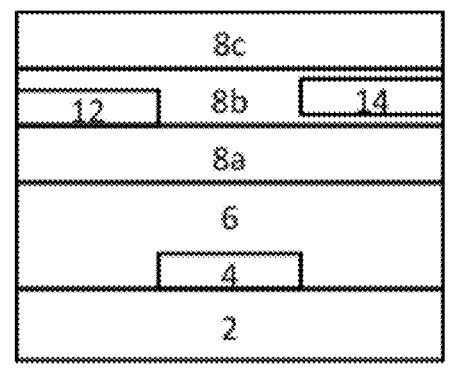
Figure 5:
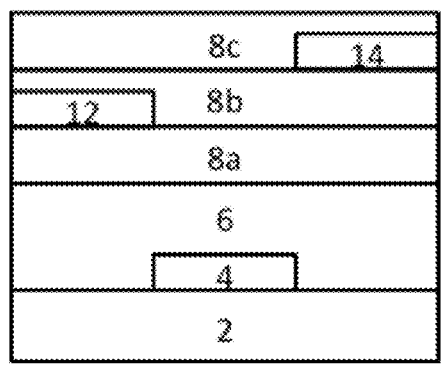
Figure 5:
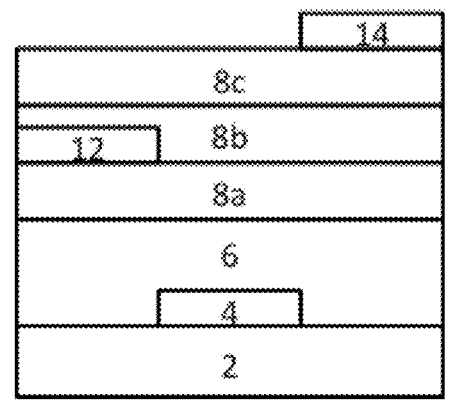
Figure 6:
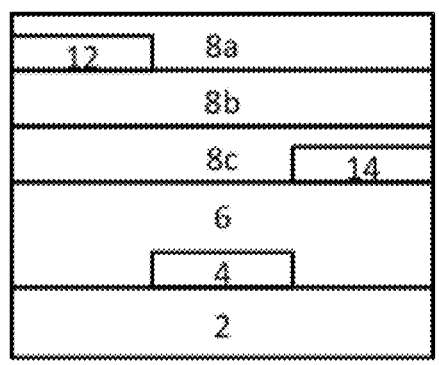
FIG. 6 illustrates different embodiments of OLETs according to the present teachings, wherein the hole electrode 12 is positioned within the hole transport sublayer 8a, and the electron electrode 14 is positioned (a) within the electron transport sublayer 8c, (b and c) within the emissive sublayer 8b, or (d) on top of the channel layer 8. In these embodiments, the hole transport sublayer 8a is the top sublayer, and the electron transport sublayer 8c is in contact with the gate insulating (dielectric) layer 6.
Figure 6:
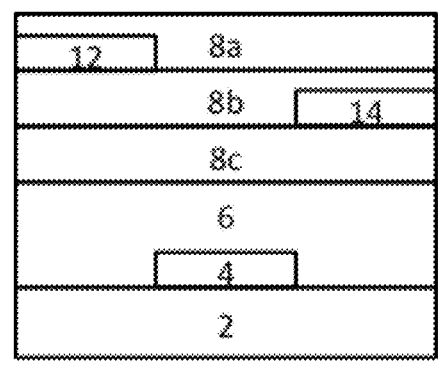
Figure 6:
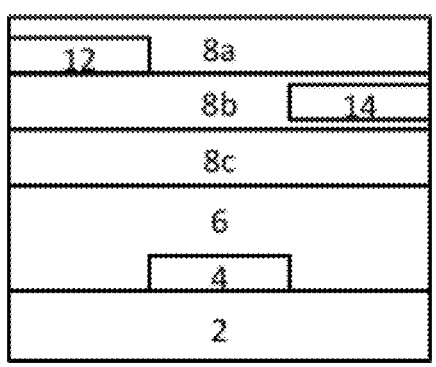
Figure 6:
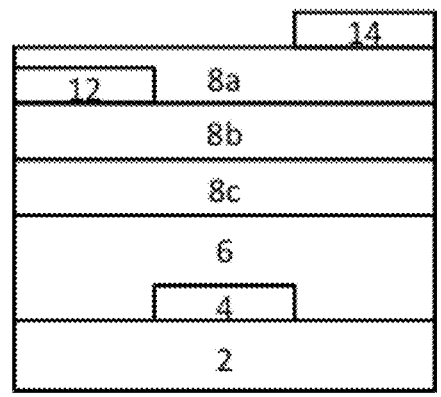
Figure 7:
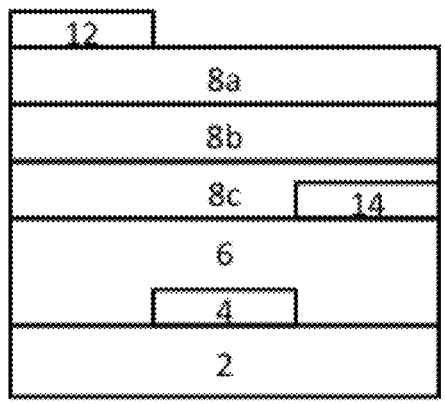
FIG. 7 illustrates different embodiments of OLETs according to the present teachings, wherein the hole electrode 12 is positioned on top of the channel layer 8 in contact with the hole transport layer 8a, and the electron electrode is positioned (a) within the electron transport sublayer 8c, (b and c) within the emissive sublayer 8b, or (d) within the hole transport sublayer 8a. In these embodiments, the hole transport sublayer 8a is the top sublayer, and the electron transport sublayer 8c is in contact with the dielectric layer 6.
Figure 7:
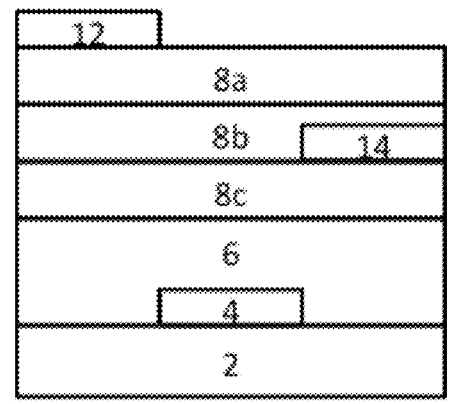
Figure 7:
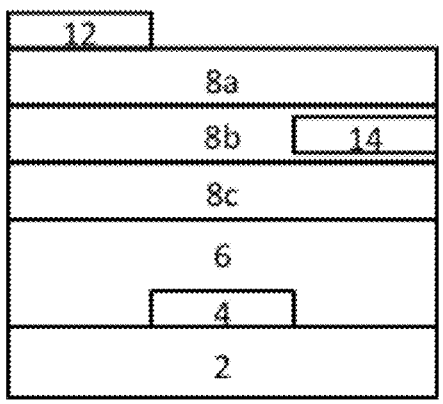
Figure 7:
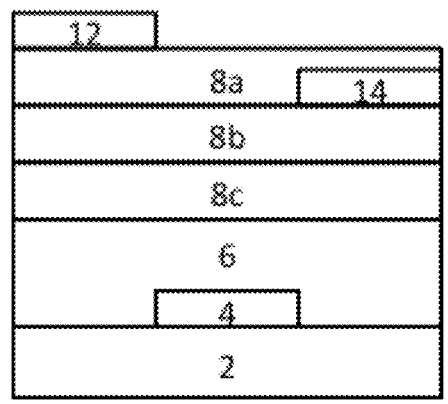

As shown in FIG. 3, an OLET 30a or 30b according to the present teachings can have a hole electrode 12 and an electron electrode 14 that are offset vertically from each other. Referring back to FIG. 1, in conventional OLETs, both the hole electrode 12 and the electron electrode 14 typically are positioned either on top of a first side 16 of the channel layer 8 or in contact with a second side 18 of the channel layer 8. Referring to FIG. 3, if d1 refers to the distance from which the hole electrode is positioned away from the second side 18 of the channel layer and d2 refers to the distance from which the electron electrode is positioned away from the second side 18 of the channel layer, then it can be seen that in a conventional OLET, d1=d2, whereas in the present OLET, d1≠d2.

With continued reference to FIG. 3, sublayer 8a can comprise a first semiconductor material having a thickness $d_{S1}$, while sublayer 8c can comprise a second semiconductor material having a thickness $d_{S2}$, and sublayer 8b can comprise an emissive material having a thickness $d_E$. Thus, in certain embodiments of the present OLETs, the hole electrode 12 and the electron electrode 14 can be positioned within different sublayers of the channel layer 8. For example, d1 can be 0 (within sublayer 8a in contact with the second side 18 of the channel layer 8), while d2 can be $d_{S1}$ (within sublayer 8b in contact with sublayer 8a) or d2 can be $d_{S1}+d_E$ (within sublayer 8c in contact with sublayer 8b). In these embodiments, the hole electrode 12 can be deposited on the layer immediately adjacent to sublayer 8a (e.g., on the dielectric layer 6 in a bottom-gate architecture illustrated in FIG. 3a, or on the substrate 2 in a top-gate architecture illustrated in FIG. 3b), while the electron electrode 14 can be deposited on the sublayer 8a (d2=$d_{S1}$) or on the sublayer 8b (d2=$d_{S1}+d_E$). In other embodiments, one of the hole electrode 12 and the electron electrode 14 can be positioned on top of the first side 16 of the channel layer 8 (d1=$d_{S1}+d_E+d_{S2}$) while the other of the hole electrode 12 and the electron electrode 14 can be positioned within sublayer 8a (d2=0), 8b (d2=$d_{S1}$), or 8c (d2=$d_{S1}+d_E$).

In various embodiments, the gate electrode can have a length ($L_G$) equal to or greater than the channel length (L), which is the distance between the edge 32 of the hole electrode 12 adjacent to the channel region and the edge 34 of the electron electrode 14 adjacent to the channel region. In certain embodiments, the gate electrode can have a length $L_G$ that is the same as the length of the channel region L and can be located within a space that is aligned with the channel region. For example, in a bottom-gate configuration as shown in FIG. 3a, the gate electrode 4 can be deposited on the substrate 2, and the dielectric layer 6 can be formed over the gate electrode 4. Then, the hole electrode 12 and the electron electrode 14 can be patterned on the dielectric layer 6 in a way such that an edge 32 of the hole electrode 12 and an edge 34 of the electron electrode 14 are aligned with the edges of the gate electrode 4. Similarly, in the top-gate configuration shown in FIG. 2b, the hole electrode 12 and the electron electrode 14 first can be patterned on the substrate 2. Then, the active channel layer 8 can be formed (e.g. via sequential deposition of sublayers 8a, 8b, and 8c) over the hole electrode 12 and the electron electrode 14, followed by the deposition of the dielectric layer 6 over the channel layer 8. Subsequently, the gate electrode 4 can be patterned on the dielectric layer, such that the edges of the gate electrode 4 are aligned with an edge 32 of the hole electrode 12 and an edge 34 of the electron electrode 14.

In other embodiments, the gate electrode can have a length $L_G$ greater than L ($L_G>L$) such that the gate electrode overlaps with the hole electrode (e.g., $L_G=L+b$), the electron electrode (e.g., $L_G=L+b'$), or both the hole electrode and the electron electrode (e.g., $L_G=L+b+b'$). For example, L can be between about 2 μm and about 500 μm, preferably between about 5 μm and about 20 μm. The hole electrode and the electron electrode, respectively, can have a length $L_h$ and a length $L_e$ that independently are between about 50 μm and about 300 μm, preferably between about 100 μm and about 200 μm. The overlap b and b' of the gate electrode with either the hole electrode and/or the electron electrode can be 0 μm and up to the length ($L_h$ or $L_e$) of the hole electrode and/or the electron electrode (i.e., $0 \leq b \leq L_h$, $0 \leq b' \leq L_e$), but preferably, the overlap is between about 0 μm and about 100 μm. Accordingly, the length $L_G$ of the gate electrode can be between about 50 μm and about 500 μm, preferably between about 100 μm and about 200 μm. The thickness $d_{S1}$ and $d_{S2}$ of the two charge transport sublayers can be between about 5 μm and about 100 μm, whereas the thickness $d_E$ of the emissive sublayer can be between about 2 μm and about 50 μm.

FIGS. 4-7 illustrate various embodiments of OLETs having nonplanar hole and electron electrodes according to the present teachings.

Figure 8:
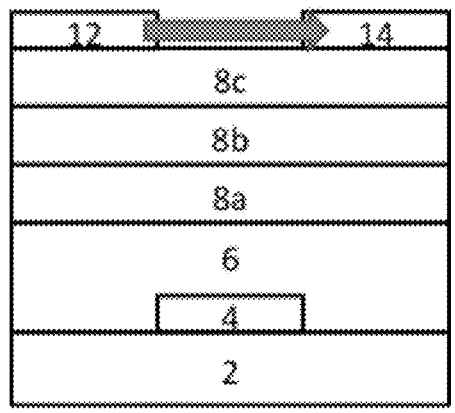
FIG. 8 compares the charge transport/light generating mechanisms of (a) a conventional trilayer OLET with planar hole and electron electrodes against (b) a trilayer OLET having nonplanar hole and electron electrodes according to the present teachings.
Figure 8:
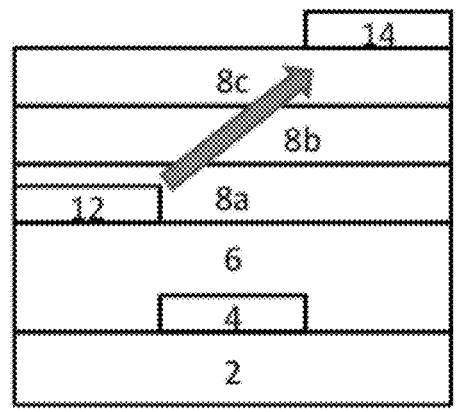
Figure 9:
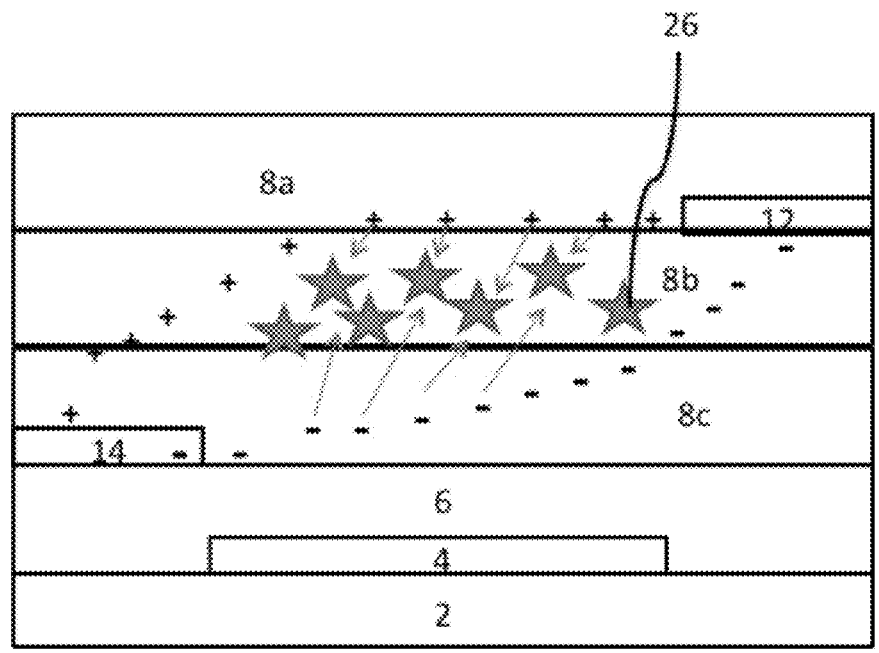
FIG. 9 illustrates how a nonplanar source-drain electric field can lead to increased exciton formation.

Without wishing to be bound to any particular theory, it is believed that having the hole electrode and the electron electrode (or the electrical source and drain contacts) in a nonplanar architecture will greatly favor exciton formation in a trilayer OLET, thus enhancing device brightness. Referring to FIG. 8a, in the conventional architecture, the source-drain electric field is parallel to the surface of the channel layer (indicated by the direction of the arrow). In this architecture, only the holes from the hole transport sublayer and the electrons from the electron transport sublayer that are electrostatically attracted into the emissive sublayer will recombine to form excitons. Therefore, the number of excitons that are actually formed often is a small fraction of the charge carriers moving through the charge transport sublayers. Referring to FIG. 8b and FIG. 9, in the architecture according to the present teachings, the source-drain electric field spans across the emissive sublayer 8b (as indicated by the direction of the arrow), that is, both hole and electron currents flow into the emissive sublayer. This results in a much greater probability for holes and electrons to meet in the emissive sublayer to form a larger number of excitons 26. Furthermore, referring back to FIG. 8a, because both the hole electrode and the electron electrode are deposited on the same surface and are in contact with a sublayer that favors the transport of only one type of charge carriers, large contact resistance inevitably results for one of the contacts. Referring to FIG. 9, the contact resistance can be reduced drastically by positioning the hole electrode 12 in contact with sublayer 8a composed of a p-type semiconductor which facilitates hole transport, and positioning the electron electrode 14 in contact with sublayer 8c composed of an n-type semiconductor which facilitates electron transport.

Figure 10:
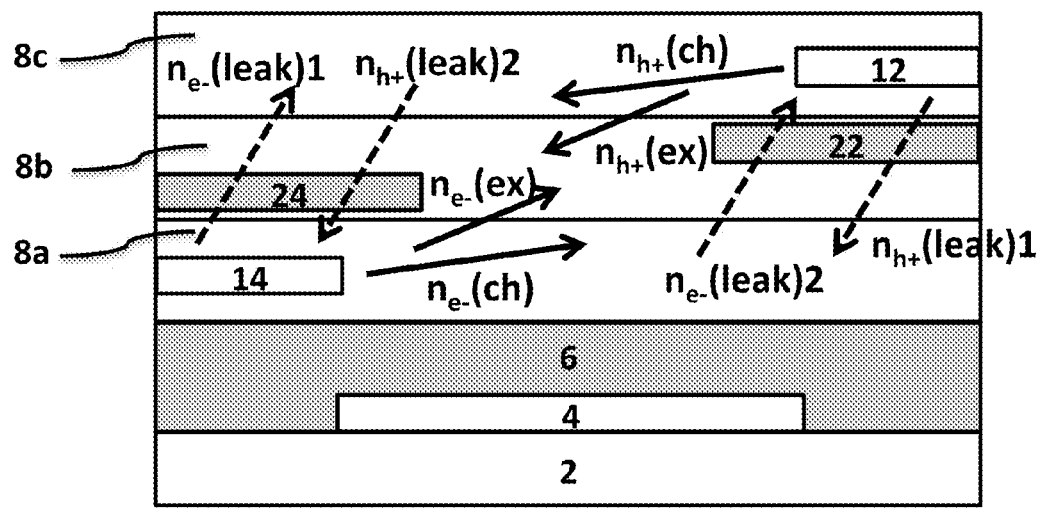
FIG. 10 illustrates how a trilayer OLET having electrically insulating elements according to the present teachings can lead to reduced leakage currents and enhanced exciton formation due to charge localization within the channel region between the hole electrode and the electron electrode (particularly, within an aperture between the two electrically insulating elements).

Further improvements in device brightness can be expected by incorporating one or more electrically insulating elements in the channel layer as described hereinabove in an OLET having non-planar hole and electron electrodes. Referring to FIG. 10, the number of charges actually forming excitons n(ex) can be expressed as:

$$n_{h+}(ex) = n_{h+}(total) - n_{h+}(ch) - n_{h+}(leak)1 - n_{h+}(leak)2$$

$$n_{e-}(ex) = n_{e-}(total) - n_{e-}(ch) - n_{e-}(leak)1 - n_{e-}(leak)2$$

wherein $n_{h+}(total)$ and $n_{e-}(total)$ respectively represent the total number of charges injected from the hole electrode and the electron electrode, n(ch) represents the number of charges in the channel region that do not get electrostatically attracted into the emissive sublayer, and n(leak)1 and n(leak)2 represent the number of charges crossing the emissive sublayer under or above the electrode areas. Because of the imbalanced charge carrier density under or above the electrode areas ($n_{e-}(leak)1 \ll n_{h+}(leak)2$ and $n_{h+}(leak)1 \ll n_{e-}(leak)2$), charge carriers in these areas are unlikely to form excitons, and $n_{e-}(leak)1$, $n_{e-}(leak)2$, $n_{h+}(leak)1$ and $n_{h+}(leak)2$ can be considered leakage currents. By incorporating electrically insulating elements 22 and/or 24, these leakage currents can be reduced and/or eliminated, thus it is expected that the density of charge carriers of opposite type crossing the emissive sublayer 8b in the channel region will increase, thereby maximizing the chance to form excitons.

Figure 11:
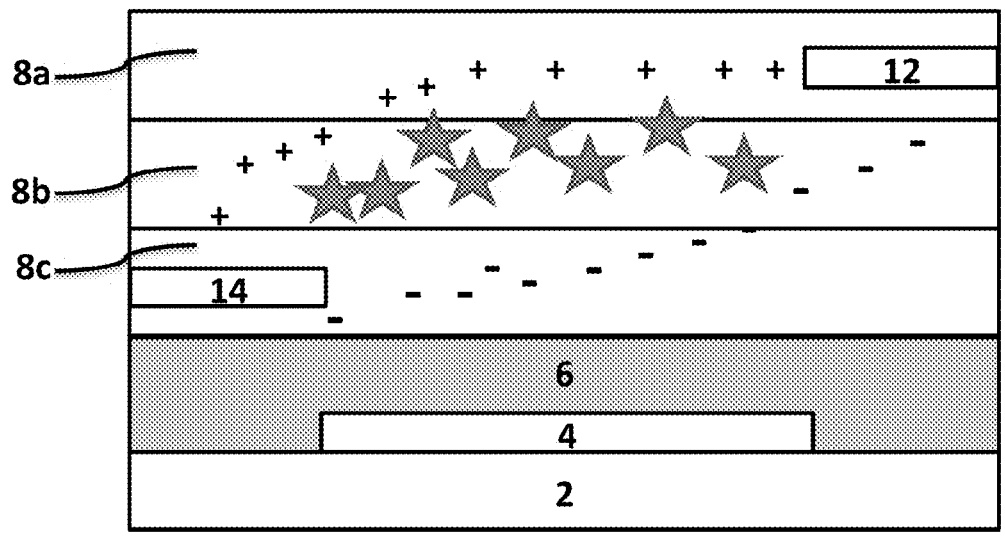
FIG. 11 illustrates a hypothetical distribution of charge carriers and excitons within the channel layer for an OLET without electrically insulating elements according to the present teachings.
Figure 12:
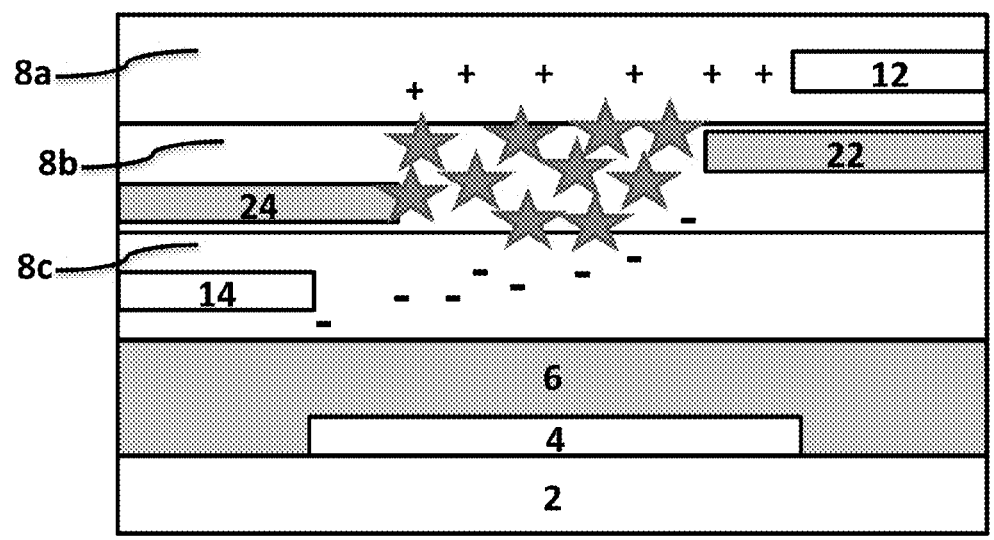
FIG. 12 illustrates a hypothetical distribution of charge carriers and excitons within the channel layer for an OLET having electrically insulating elements according to the present teachings. Compared to the device illustrated in FIG. 11, a higher density of excitons (stars) is expected within an aperture between the electrically insulating elements 22 and 24 in the present OLET.

Referring to FIG. 12 which shows an OLET including electrically insulating elements 22 and 24, holes injected from the hole electrode 12 are expected to be localized in the hole transport sublayer 8a between the hole electrode 12 and the area above the electrically insulating element 24 while electrons injected from the electron electrode 14 are expected to be localized in the electron transport sublayer 8c between the electron electrode 14 and the area below the electrically insulating element 22. When compared to the OLET shown in FIG. 11 which does not include any electrically insulating elements within the channel layer, it can be seen that the OLET shown in FIG. 12 is expected to have a higher density of both holes and electrons within the channel region between the hole electrode 12 and the electron electrode 14, more specifically, between the electrically insulating elements 22 and 24, and in turn enhanced exciton formation can be expected.

Figure 13:
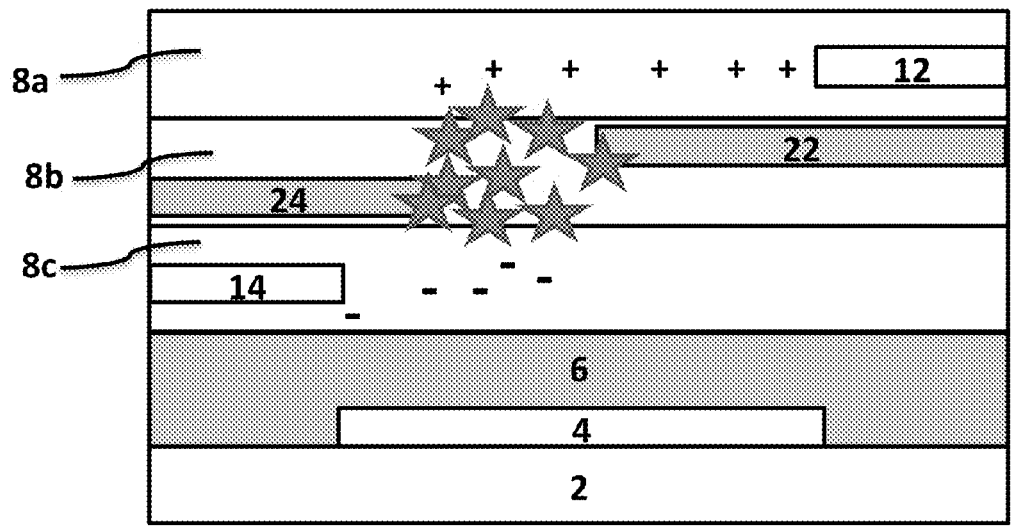
FIG. 13 illustrates how an OLET having electrically insulating elements according to the present teachings can allow more precise spatial control of where light is generated by varying the lengths of the electrically insulating elements (and in turn, the location of the aperture between the electrically insulating elements).
Figure 13:
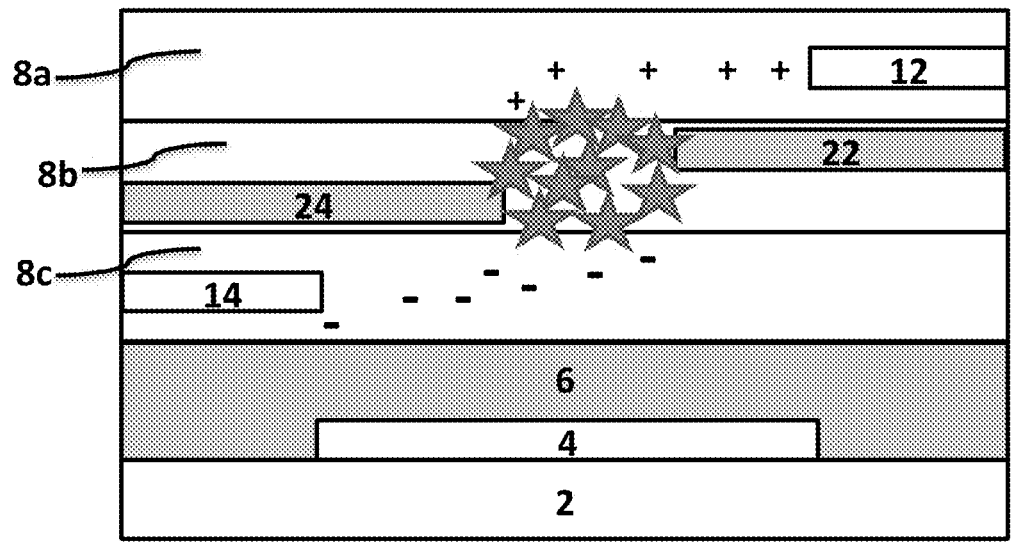

Referring to FIG. 13, the incorporation of electrically insulating elements within the channel layer also allows more precise spatial control of where light is generated, and with less dependence upon gate voltage. In particular, it is possible to modulate where the positive and negative charges flow through the emissive sublayer 8b by varying the individual length of the electrically insulating elements 22 and 24.

Figure 14:
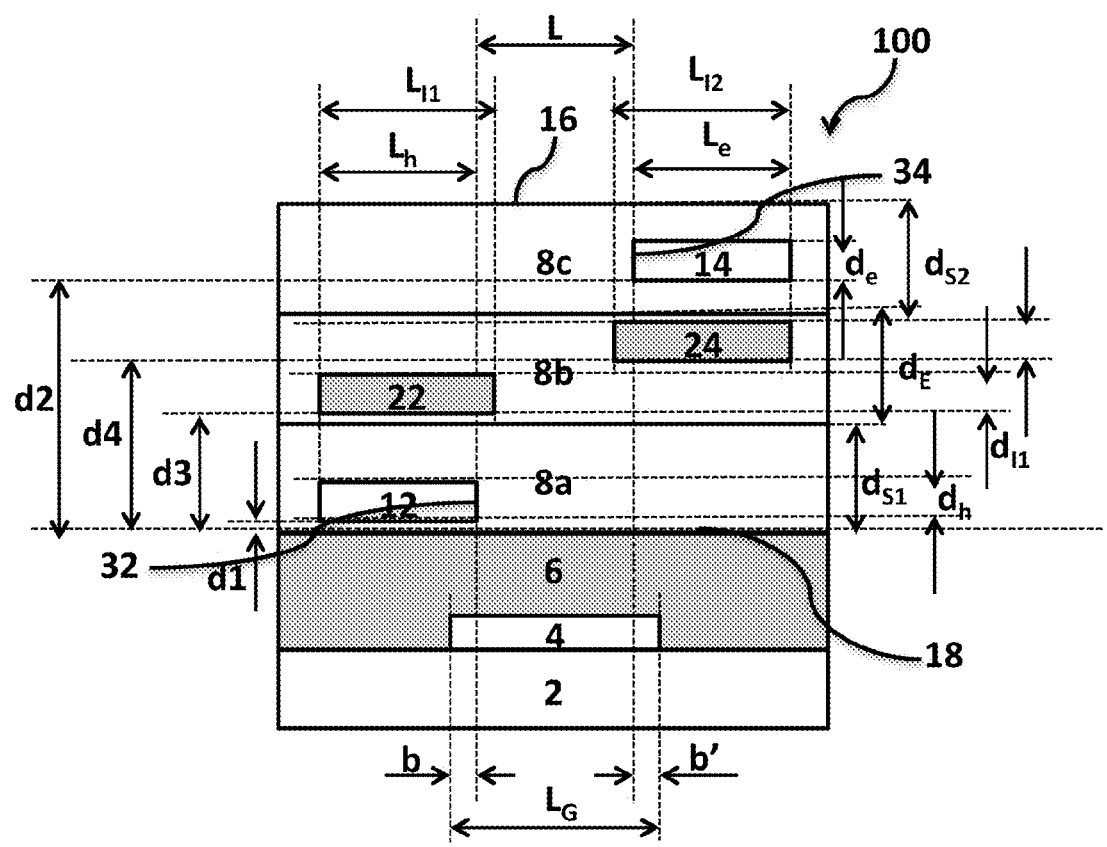
FIG. 14 provides a schematic of a bottom-gate OLET according to the present teachings having a pair of nonplanar hole electrode 12 and electron electrode 14 and a corresponding pair of nonplanar electrically insulating elements 22 and 24.

Accordingly, an OLET according to the present teachings 100 can have a first electrically insulating element 22 and/or a second electrically insulating element 24 within the channel layer, and optionally a hole electrode 12 and an electron electrode 14 that are offset vertically from each other. Referring to FIG. 14, the hole electrode 14 can be positioned vertically away from a side (e.g., the bottom side 18) of the channel layer at a distance d1, while the electron electrode 14 can be positioned vertically away from the same side of the channel layer at a distance d2. The distances d1 and d2 can be the same or different. For example, in some embodiments, both d1 and d2 can be 0, thereby providing a bottom-contact device. In some embodiments, both d1 and d2 can be $d_{S1}+d_E+d_{S2}$ (where $d_{S1}$ is the thickness of the first charge transport sublayer 8a, $d_E$ is the thickness of the emissive sublayer 8b, and $d_{S2}$ is the thickness of the second charge transport sublayer 8c), thereby providing a top-contact device. In other embodiments, $d_1$ can be 0 (within sublayer 8a in contact with the bottom side 18 of the channel layer 8), while d2 can be $d_{S1}$ (within emissive sublayer 8b in contact with first charge transport sublayer 8a) or d2 can be $d_{S1}+d_E$ (within second charge transport sublayer 8c in contact with emissive sublayer 8b). In these embodiments, the hole electrode 12 can be deposited on the layer immediately adjacent to sublayer 8a (e.g., on the dielectric layer 6 in a bottom-gate architecture, or on the substrate 2 in a top-gate architecture), while the electron electrode 14 can be deposited on the sublayer 8a ($d2=d_{S1}$) or on the sublayer 8b ($d2=d_{S1}+d_E$). In other embodiments, one of the hole electrode 12 and the electron electrode 14 can be positioned on top of the first side 16 of the channel layer 8 ($d1=d_{S1}+d_E+d_{S2}$) while the other of the hole electrode 12 and the electron electrode 14 can be positioned within sublayer 8a (d2=0), 8b ($d2=d_{S1}$), or 8c ($d2=d_{S1}+d_E$).

The hole electrode 12 has a thickness $d_h$ and a length $L_h$, while the electron electrode 14 has a thickness $d_e$ and a length $L_e$. In the embodiment shown in FIG. 14, the hole electrode 12 is embedded within or otherwise positioned in contact with the hole transport sublayer 8a, while the electron electrode 14 is embedded within or otherwise positioned in contact with the electron transport sublayer 8c. In this embodiment, d2>d1 given that the hole transport sublayer 8a is positioned above the electron transport sublayer 8c. The electrically insulating element 22 which has a thickness $d_{I1}$ can be positioned away from the bottom side 18 of the channel layer at a distance d3, where $d3 \geq d1+d_h$. Similarly, the electrically insulating element 24 which has a thickness $d_{I2}$ can be positioned away from the bottom side 18 of the channel layer at a distance d4, where $d4 \leq d2$. Typically, d3 is no greater than d4, and d4 is no less than d3. To ensure that the channel region between the hole electrode 12 and the electron electrode 14 remains accessible for charge carriers to cross into the emissive sublayer 8b despite the presence of the electrically insulating elements 22 and 24, the length $L_{I1}$ of the electrically insulating element 22 typically is between $L_h/2$ and $L_h+L/3_{S1}+d_E$, while the length $L_{I2}$ of the electrically insulating element 24 can be between $L_e/2$ and $L_e+L/3$. For example, L can be between about 2 μm and about 500 μm, preferably between about 5 μm and about 20 μm. The hole electrode and the electron electrode, respectively, can have a length $L_h$ and a length $L_e$ that independently are between about 50 μm and about 300 μm, preferably between about 100 μm and about 200 μm. To illustrate, if $L_h$ and $L_e$ are about 100 μm, and L also is about 100 μm, then $L_{I1}$ and $L_{I2}$ can be between about 50 μm and about 133 μm. The thickness $d_{I1}$ and $d_{I2}$ of the electrically insulating elements can be between about 5 μm and about 50 μm.

Figure 15:
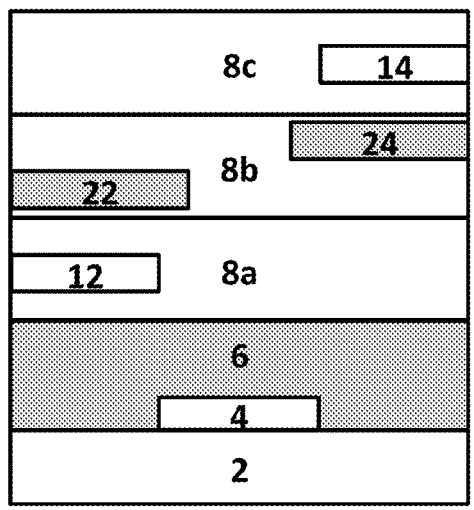
FIG. 15 illustrates (a) a bottom-gate OLET and (b) a top-gate OLET according to the present teachings, wherein a pair of nonplanar electrically insulating elements 22 and 24 are positioned with the emissive sublayer 8b.
Figure 15:
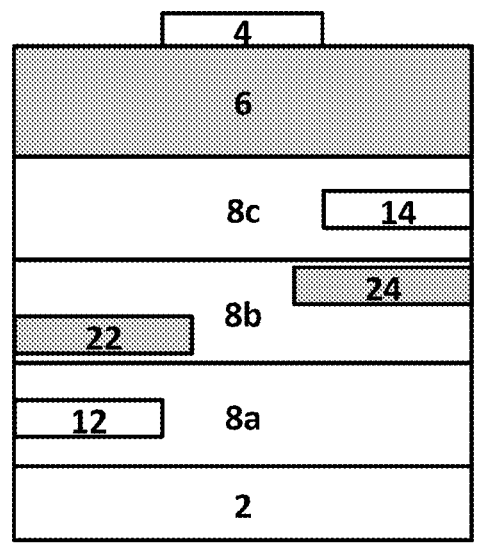
Figure 16:
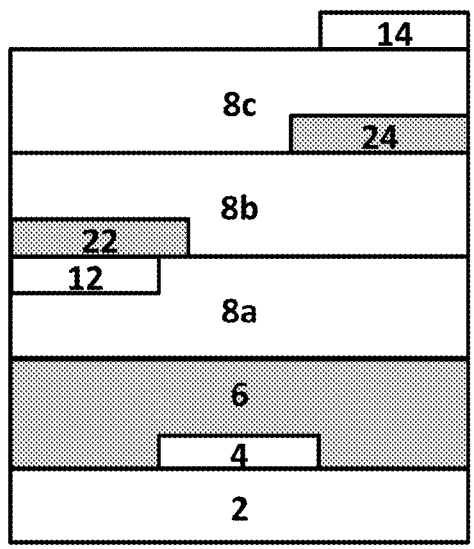
FIG. 16 illustrates two different bottom-gate OLETs according to the present teachings, wherein an electrically insulating element 22 and an electrically insulating element 24 are in contact with different sides of the emissive sublayer 8b. In particular, the electrically insulating element 22 is deposited on the hole transport sublayer 8a and the electrically insulating element 24 is deposited on the emissive sublayer 8b in contact with the electron transport sublayer 8c.
Figure 16:
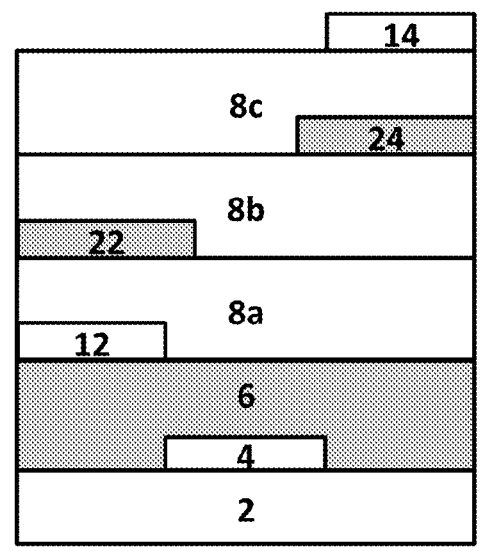
Figure 17:
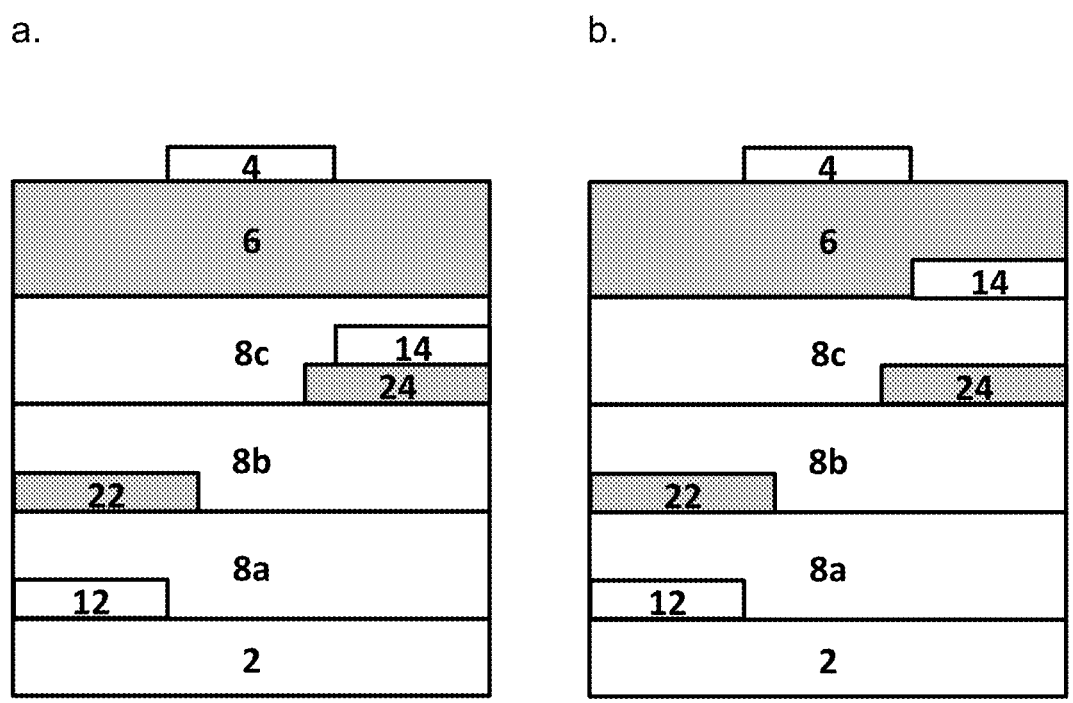
FIG. 17 illustrates two different top-gate OLETs according to the present teachings, wherein an electrically insulating element 22 and an electrically insulating element 24 are in contact with different sides of the emissive sublayer 8b. In particular, the electrically insulating element 22 is deposited on the hole transport sublayer 8a and the electrically insulating element 24 is deposited on the emissive sublayer 8b in contact with the electron transport sublayer 8c.

FIGS. 15-17 illustrate several preferred embodiments of OLETs according to the present teachings. Each of these OLETs has electrically insulating elements 22 and 24 below or above a pair of nonplanar hole electrode 12 and electron electrode 14. The hole electrode 12 is positioned in contact with the hole transport sublayer 8a, while the electron electrode 14 is positioned in contact with the electron transport sublayer 8c, to allow the best charge injection and transport. The electrically insulating elements are positioned in contact with the emissive sublayer 8b to maximize charge flow into the emissive sublayer within the channel region between the hole electrode and the electron electrode, thereby enhancing charge localization and device brightness.

For ease of processing, the electrically insulating elements 22 and 24 can be positioned on the same plane, and used in combination with planar or nonplanar hole electrode and electron electrode. For example, referring back to FIG. 2, the OLETs shown in FIGS. 2a, 2b, 2c, and 2d each have planar hole electrode and electron electrode, and the electrically insulating elements can be deposited on one of the charge transport sublayers 8a (FIG. 2a) or 8c (FIG. 2c), or on the emissive sublayer 8b (FIGS. 2b and 2d). Although these embodiments may encounter more contact resistance for one type of the charge carriers (e.g., holes injected from hole electrode 12 must overcome the contact resistance in the electron transport sublayer 8c), the devices shown in FIG. 2 can be fabricated with fewer shadow masks, deposition, and/or photolithography/etching steps, which in turn can result in lower fabrication costs.

Figure 18:
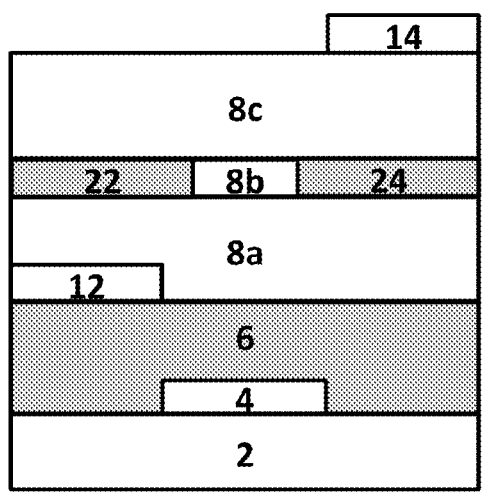
FIG. 18 illustrates different embodiments of OLETs according to the present teachings, wherein the electrically insulating elements 22 and 24 together with the emissive sublayer 8b form a single planar sublayer.
Figure 18:
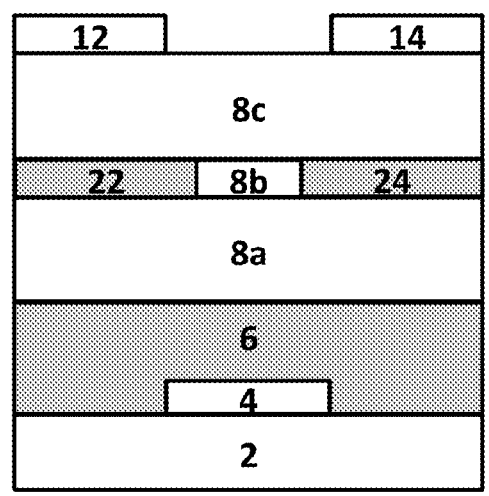
Figure 18:
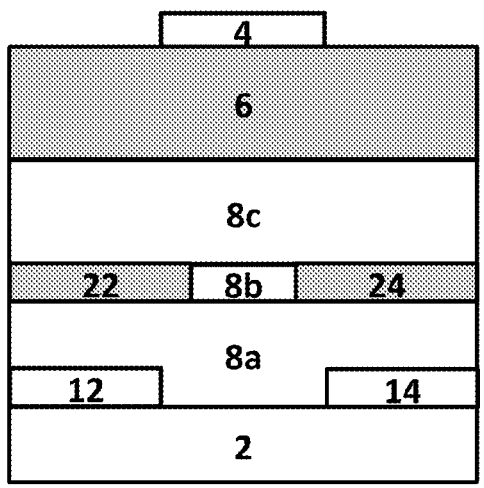
Figure 18:
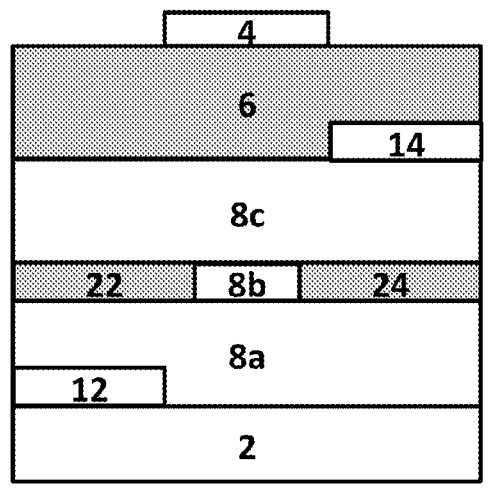

Referring to FIG. 18, the electrically insulating elements 22 and 24 can have the same thickness as the emissive sublayer 8b, and the electrically insulating elements 22 and 24 together with the emissive sublayer 8b can form a single planar sublayer sandwiched between the two charge transport sublayers 8a and 8c. In these embodiments, because the electrically insulating elements tend to provide a smoother surface for further processing than the emissive material (which often comprises a mixture of host materials and emitters), the semiconductor film deposited thereon can be expected to have better morphology and the device as a whole can be expected to have better stack planarization.

The OLETs described herein also can include charge injection layers. For example, the hole electrode and the electron electrode can be coated with a hole injection layer and an electron injection layer, respectively, to further reduce contact resistance. More generally, a hole injection layer can be deposited between the hole transport sublayer and the hole electrode, and an electron injection layer can be deposited between the electron electrode and the electron transport sublayer.

Further, the present OLETs can include a surface-modified substrate, wherein the substrate is coated with a surface-modifier to allow improved processing such as better adhesion with the layer to be deposited thereon. The present OLETs also can include a passivation layer coupled to the top (first) side of the channel layer. For example, if the top charge transport sublayer comprises a metal oxide semiconductor, it may be preferred to have the metal oxide semiconductor layer covered by a passivation layer to improve device stability.

OLETs according to the present teachings can be fabricated using various deposition processes known in the art. For example, in a bottom-gate configuration, an optional planarization or surface-modifying layer can be formed onto a transparent substrate, e.g., by spin-coating. A metallic thin film can be thermally evaporated thereon, followed by etching or other patterning techniques to form the gate electrode. The dielectric layer, depending on its composition, can be deposited by a solution-phase process such as spin-coating or by chemical or physical vapor deposition. This can be followed by the formation of the active channel layer via sequential deposition of the first charge transport sublayer, the emissive sublayer, and the second charge transport sublayer. The hole electrode and the electron electrode can be formed using similar or different techniques as the gate electrode. Depending on the location of the electrically insulating elements, at least one of the first charge transport sublayer, the emissive sublayer, and the second charge transport sublayer can be deposited in multiple steps, allowing formation of the electrically insulating elements within the channel layer. The electrically insulating elements can be formed by sputtering, ion-assisted deposition (IAD), atomic layer deposition, chemical vapor deposition, physical vapor deposition, different types of printing techniques (e.g., flexo printing, litho printing, gravure printing, ink-jetting, pad printing, and so forth), drop casting, dip coating, doctor blading, roll coating, and spin-coating. These techniques also can be used to form the channel layer and/or the dielectric layer. In preferred embodiments, both the channel layer and the dielectric layer can be formed from a solution-phase process such as spin-coating, slot coating, or printing. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

The present OLETs can be fabricated on various substrates, including plastic, flexible substrates that have a low temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be a rigid transparent substrate such as glass, quartz and VYCOR®. Substrate-gate materials commonly used in thin-film transistors also can be used. Examples include doped silicon wafer, tin-doped indium oxide (ITO) on glass, tin-doped indium oxide on polyimide or mylar film, aluminum or other metals alone or coated on a polymer such as polyethylene terephthalate, a doped polythiophene, and the like.

The source/drain electrodes (or hole/electron electrodes) as well as the gate electrode can be made using various deposition techniques. For example, the electrodes can be deposited through a mask, or can be deposited then etched or lifted off (photolithography). Suitable deposition techniques include electrodeposition, vaporization, sputtering, electroplating, coating, laser ablation and offset printing, from metal or metal alloy including copper, aluminum, gold, silver, molybdenum, platinum, palladium, and/or nickel, or an electrically conductive polymer such as polyethylenethioxythiophene (PEDOT). Charge carrier injection can be facilitated by the use of a material for the injection electrode (hole electrode or electron electrode) that has a low barrier against injection of a charge carrier type into the hole transport sublayer and the electron transport sublayer, respectively. For example, the electron electrode can comprise one or more elements selected from the group consisting of Au, Ca, Mg, Al, In, and a perovskite manganites ($RE_{1-x}A_xMnO_3$, RE=rare earth element such as La, Nd, Pr etc., A=alkaline metal). The hole electrode can comprise at least one material selected from the group consisting of Au, indium tin oxide, Cr, Cu, Fe, Ag, poly(3,4-ethylenedioxthiophene) combined with poly (styrenesulfonate) (PEDOT:PSS), and a perovskite manganite ($Re_{1-x}A_xMnO_3$). In certain embodiments, the hole electrode and the electron electrode can be made of conductors with different work functions to favor both hole and electron injection.

The dielectric layer can be composed of inorganic (e.g., oxides such as $SiO_2$, $Al_2O_3$, or $HfO_2$; and nitrides such as $Si_3N_4$), organic (e.g., polymers such as polycarbonate, polyester, polyimide, polystyrene, polyhaloethylene, polymethylmethacrylate), or hybrid organic/inorganic materials. The dielectric layer can be coupled to the gate electrode (bottom-gate) or the channel layer (top-gate) by various methods known in the art. In addition to the methods already described, the dielectric layer can be formed via the growth of self-assembled nanodielectric materials (such as those described in Yoon et al., *PNAS*, 102 (13): 4678-4682 (2005), and Ha et al., *Chem. Mater.*, 21(7): 1173-1175 (2009)); solution-processing of inorganic/organic hybrid materials (e.g., as described in Ha et al., *J. Am. Chem. Soc.*, 132 (49): 17428-17434 (2010)); and low-temperature solution-processing of metal oxides (e.g., as described in International Publication Number WO 2012/103528). Furthermore, the dielectric material can be in the form of a bilayer composed of different materials, for example, a combination of inorganic/organic materials, materials with different dielectric constants, or materials that can be processed by different techniques (e.g., solution-processing and vapor deposition). Any materials and methods of processing for gate dielectrics known in the art can be used in connection with the present electrically insulating elements.

With respect to the composition of the channel layer, various p-type semiconductors, n-type semiconductors, and organic electroluminescence semiconductors known in the art can be used according to the present teachings, respectively, as the hole transport sublayer, the electron transport sublayer, and the emissive sublayer in the present OLET. For example, the channel layer can comprise small molecule materials, polymers, and/or metal complexes.

Suitable materials for the electron transport (n-type) sublayer can include one class of n-type organic semiconductors (OSCs) that relates to oligomers, homopolymers or copolymers of thiophenes, particularly those substituted with fluorocarbons. For example, $\alpha,\omega$-diperfluorohexylquaterhiophenes and other fluorocarbon-substituted thiophene oligomers are described in U.S. Pat. No. 6,585,914.

Another class of n-type OSCs relates to fused ring tetracarboxylic diimides and their derivatives. For example, cyanated perylene diimides and cyanated naphthalene diimides, more specifically, N,N'-bis-substituted-(1,7 & 1,6)-di-cyano-perylene-3,4:9,10-bis(dicarboximide)s and N,N'-bis-substituted 2,6-dicyanonaphthalene-1,4,5,8-bis(dicarboximide)s such as those described in U.S. Pat. Nos. 7,671,202, 7,902,363, and 7,569,693, and U.S. Patent Application Publication No. 2010/0319778 have been used as n-type semiconductors. Specific examples include N,N'-bis(cyclohexyl)-(1,7 & 1,6)-dicyano-perylene-3,4:9,10-bis(dicarboximide) ($CN_2PDI$); N,N'-bis(1H-perfluorobutyl)-(1,7 & 1,6)-di-cyano-perylene-3,4:9,10-bis(dicarboximide); N,N'-bis(n-octyl)-(1,7 & 1,6)-di-cyano-perylene-3,4:9,10-bis(dicarboximide) (PDI-$8CN_2$); N,N'-bis(n-octyl)-2,6-di-cyanonaphthalene-1,4,5,8-bis(dicarboximide) (NDI-$8CN_2$); N,N'-bis(2-methylhexyl)-(1,7 & 1,6)-dicyanoperylene-3,4:9,10-bis(dicarboximide); N,N'-bis(2-ethylhexyl)-(1,7 & 1,6)-dicyanoperylene-3,4:9,10-bis(dicarboximide); N,N'-bis[(3S)-3,7-dimethyl-6-octenyl]-(1,7 & 1,6)-dicyanoperylene-3,4:9,10-bis(dicarboximide); N,N'-bis(4-n-hexylphenyl)-(1,7 & 1,6)-dicyanoperylene-3,4:9,10-bis(dicarboximide); N,N'-bis(4-n-dodecylphenyl)-(1,7 & 1,6)-dicyanoperylene-3,4:9,10-bis(dicarboximide); N,N'-bis{4-[(3S)-3,7-dimethyl-6-octenyl]phenyl}-(1,7 & 1,6)-dicyanoperylene-3,4:9,10-bis(dicarboximide); N,N'-bis(4-heptyloxyphenyl)-(1,7 & 1,6)-dicyanoperylene-3,4:9,10-bis(dicarboximide); N,N'-bis(4-biphenylyl)-(1,7 & 1,6)-dicyanoperylene-3,4:9,10-bis(dicarboximide); N,N'-bis[4-(4'-n-octylbiphenylyl)]-(1,7 & 1,6)-dicyanoperylene-3,4:9,10-bis(dicarboximide); N,N'-bis{4-[4'-((3S)-3,7-dimethyl-6-octenyl]biphenylyl}-(1,7 & 1,6)-dicyanoperylene-3,4:9,10-bis(dicarboximide); N,N'-bis[4-(2',3',4',5',6'-pentafluorobiphenyl)]-(1,7 & 1,6)-dibromoperylene-3,4:9,10-bis(dicarboximide); N,N'-bis[4-(4'-n-octyl-2',3',5',6'-tetrafluorobiphenyl)]-(1,7 & 1,6)-dicyanoperylene-3,4:9,10-bis(dicarboximide); N,N'-bis[4-(4'-n-octyl-2,3,5,6-tetrafluorobiphenyl)]-(1,7 & 1,6)-dicyanoperylene-3,4:9,10-bis(dicarboximide); N,N'-bis(benzyl)-(1,7 & 1,6)-dicyanoperylene-3,4:9,10-bis(dicarboximide); N,N'-bis(4-n-butylbenzyl)-(1,7 & 1,6)-dicyanoperylene-3,4:9,10-bis(dicarboximide); N,N'-bis(4-sec-butylphenyl)-(1,7 & 1,6)-dicyanoperylene-3,4:9,10-bis(dicarboximide); N,N'-bis{4-[(3S)-3,7-dimethyl-6-octenyloxy]benzyl}-(1,7 & 1,6)-dicyanoperylene-3,4:9,10-bis(dicarboximide); N,N'-bis(4-benzylphenyl)-(1,7 & 1,6)-dicyanoperylene-3,4:9,10-bis(dicarboximide); N,N'-bis{4-[1-(2-phenylethyl)]phenyl}-(1,7 & 1,6)-dicyanoperylene-3,4:9,10-bis(dicarboximide); N,N'-bis(4-n-benzoylphenyl)-(1,7 & 1,6)-dicyanoperylene-3,4:9,10-bis(dicarboximide); N,N'-bis(1-methylbutyl)-(1,7 & 1,6)-dicyanoperylene-3,4:9,10-bis(dicarboximide); N,N'-bis(1-methylpentyl)-(1,7 & 1,6)-dicyanoperylene-3,4:9,10-bis(dicarboximide); N,N'-bis(1-methylhexyl)-(1,7 & 1,6)-dicyanoperylene-3,4:9,10-bis(dicarboximide); N,N'-bis(1-ethylpropyl)-(1,7 & 1,6)-dicyanoperylene-3,4:9,10-bis(dicarboximide); N,N'-bis(1-ethylbutyl)-(1,7 & 1,6)-dicyanoperylene-3,4:9,10-bis(dicarboximide); N,N'-bis(1-ethylpentyl)-(1,7 & 1,6)-dicyanoperylene-3,4:9,10-bis(dicarboximide); N,N'-bis(1-ethylhexyl)-(1,7 & 1,6)-dicyanoperylene-3,4:9,10-bis(dicarboximide); and N,N'-bis(1,3-dimethylbutyl)-(1,7 & 1,6)-dicyanoperylene-3,4:9,10-bis(dicarboximide).

More recently, hybrid perylene/naphthalene diimides, pi-bridge linked dimeric naphthalene diimides, and large disc-like ovalene diimides (with optional cyano substituents) have been reported as n-type semiconductors. See Yue et al., "Hybrid Rylene Arrays via Combination of Stille Coupling and C—H Transformation as High-Performance Electron Transport Materials," *J. Am. Chem. Soc.* (2012); Hwang et al., "Stable Solution-Processed Molecular n-Channel Organic Field-Effect Transistors," *Adv. Mater.* (2012) and Polander et al., "Solution-Processed Molecular Bis(Naphthalene Diimide) Derivatives with High Electron Mobility," *Chem. Mater.*, 23: 3408-3410 (2011); Li et al., "Disc-like 7,14-dicyano-ovalene-3,4:10,11-bis(dicarboximide) as a solution-processible n-type semiconductor for air stable field-effect transistors," *Chem. Sci.*, 3: 846-850 (2012). Naphthalene diimides fused with 2-(1,3-dithio-2-ylidene)malonitrile groups also have been reported as n-type semiconductors. See Gao et al., "Core-Expanded Naphthalene Diimides Fused with 2-(1,3-Ditiol-2-Ylidene)Malonitrile Groups for High-Performance Ambient-Stable, Solution-Processed n-Channel Organic Thin Film Transistors," *J. Am. Chem. Soc.*, 132(11): 3697-3699 (2010).

Another class of n-type semiconductors relates to dicyanomethylene-substituted conjugated systems. For example, U.S. Pat. No. 7,928,249 describes dicyanomethylene-substituted fused ring compounds such as 2,8-di-(3-dodecylthien-2-yl)-indeno[1,2-b]fluorene-6,12-dimalonitrile; 2,8-dithien-2-yl-tetraphenylenedimalonitrile; and 2,8-di-(4'-dodecylthien-2'-yl]-4-dodecylthien-2-yl)-indeno[1,2-b]fluorene-6,12-dimalono-nitrile. Dicyanomethylene-substituted diketopyrrolopyrrole-containing quinoidal small molecules also have been investigated as n-type semiconductors. See Qiao et al., "Diketopyrrolopyrrole-Containing Quinoidal Small Molecules for High-Performance, Air-Stable, and Solution-Processable n-Channel Organic Field-Effect Transistors," *J. Am. Chem. Soc.*, 134: 4084-4087 (2012).

Thionated aromatic bisimides also can be used as n-type semiconductors. Examples include those described in International Publication Nos. WO2011/082234 such as (S,S)-$PDIS_1MP$, (S,S)-cis-$PDIS_2MP$, (S,S)-trans-$PDIS_2MP$, (S,S)-PDIS$_3$1MP, (S,S)—PDIS$_4$1MP, (S,S)-trans-PDIS$_2$1Mhex, (R,R)-trans-PDIS$_2$1Mhex, (S,R)-trans-PDIS$_2$1Mhex, (R,S)-trans-PDIS$_2$1Mhex, (R,R)-trans-PDIS$_2$1Mhept, (S,S)-trans-PDIS$_2$1MO, trans-PDIS$_2$1Epr, cis-PDIS$_2$1Epr, trans-PDIS$_2$1M3MB, trans-PDIS$_2$2OD, trans-PDIS$_2$1MP-CN$_2$, cis-NDIS$_2$Cy, trans-NDIS$_2$Cy, NDIS$_1$2EH, trans-NDIS$_1$2EH, cis-NDIS$_1$2EH, NDIS$_3$2EH, SPDI-F, trans-PDIS$_2$1MP-F$_2$, and S-C2OD-C6$_2$.

N-type semiconducting polymers also can be used according to the present teachings. Examples of n-type semiconducting polymers include oligomers, homopolymers and copolymers of naphthalenediimides described in U.S. Patent Application Publication No. US 2010/0326527 such as poly{N,N'-bis(2-ethylhexyl)-1,4,5,8-naphthalene diimide-2,6-diyl]-alt-5,5'-(2,2'-bithiophene)}; poly{N,N'-bis(2-ethylhexyl)-1,4,5,8-naphthalene diimide-2,6-diyl]-alt-5,5'-(2,5-thiophene)}; poly{N,N'-bis(2-octyldodecyl)-1,4,5,8-naphthalene diimide-2,6-diyl]-alt-5,5'-(2,2'-bithiophene)}; poly{N,N'-bis(1-methylhexyl)-1,4,5,8-naphthalene diimide-2,6-diyl]-alt-5,5'-(2,2'-bithiophene)}; poly{N,N'-bis(2-octyldodecyl)-1,4,5,8-naphthalene diimide-2,6-diyl]-alt-5,5'''-(quarterthiophene)}; poly{N,N'-bis(2-octyldodecyl)-1,4,5,8-naphthalene diimide-2,6-diyl]-alt-5,5'-(2,2'-bithiazole)}; poly{N,N'-bis(2-octyldodecyl)-1,4,5,8-naphthalene diimide-2,6-diyl]-alt-5,5'-(4',7'-di-2-thienyl-2',1',3',-benzothiadiazole)}; poly{N,N'-bis(2-octyldodecyl)-1,4,5,8-naphthalene diimide-2,6-diyl]-alt-5,5'-(1',4'-di-2-thienyl-2',3',5',6'-tetrafluorobenzene)}; poly{N,N'-bis(2-octyldodecyl)-1,4,5,8-naphthalene diimide-2,6-diyl]-alt-5,5'-(1,2-bis(2'-thienyl) vinyl)}; poly{N,N'-bis(2-octyldodecyl)-1,4,5,8-naphthalene diimide-2,6-diyl]-alt-5,5'-(2,6-bis(2'-thienyl)naphthalene)}; and poly{N,N'-bis(2-octyldodecyl)-1,4,5,8-naphthalene diimide-2,6-diyl]-alt-5,5'-(1,1'-dimethyl-2,2'-bipyrrole)}.

Other linear acenes, bent acenes, arylvinylenes, phenylenes, and fused (hetero)arenes including those substituted with alkylcarbonyl, arylcarbonyl, cyano and/or alkyl groups also can be suitable n-type semiconductor materials for use according to the present teachings.

In certain embodiments, inorganic n-type OSCs can be used. For example, solution-processable metal oxides (e.g., ITO, indium oxide, indium zinc oxide, indium gallium zinc oxide) and chalcogenides (e.g., CdSe) are described in U.S. Pat. No. 8,017,458 and International Publication No. WO 2012/103528.

Suitable materials for the hole transport (p-type) sublayer can include one class of p-type organic semiconductors (OSCs) that relates to oligothiophenes and polythiophenes. For example, a dihexylquaterhiophene and other alkyl-substituted thiophene oligomers are described in Garnier et al., "Dihexylquaterthiophene, A Two-Dimensional Liquid Crystal-Like Organic Semiconductor with High Transport Properties," Chem. Mater., 10 (11): 3334-3339 (1998). Polythiophenes such as regioregular poly(3-hexylthiophene) (rr-P3HT) also can be used.

Another class of p-type OSCs relates to soluble pentacene compounds such as those described in U.S. Pat. No. 7,125,989. Soluble pentacene compounds, as exemplified by pentacene-N-sulfinyl-tert-butylcarbamate, can be obtained from Diels-Alder reaction of pentacene with hetero dienophiles. Another pentacene derivative, 6,13-bis(triisopropyl-silylethynyl)pentacene (TIPS pentacene), also has been shown to have reasonable solubility in common organic solvents.

Further classes of p-type semiconductors include thienocoronene-based compounds described in International Publication No. WO2012/030662. Specific examples include 1PB-thienocoronene, 2BO-thienocoronene, 1MP-thienocoronene, (S)-2MB-thienocoronene, undecanoxy-thienocoronene, and dodecyl-thienocoronene.

More recently, alkylated [1]benzothieno[3,2-b]benzothiophenes and alkylated dinaphtho[2,3-b:2',3'-f]thieno[3,2-b]thiophenes have been reported as highly soluble p-type OSCs. See Ebata, H. et al., "Highly Soluble [1]Benzothieno[3,2-b]benzothiophenes (BTBT) Derivatives for High-Performance, Solution-Processed Organic Field-Effect Transistors," JACS, 129(51): 15732-15733 (2007); Ebata, H. et al., "Alkylated Dinaphtho[2,3-b:2',3'-f]Thieno[3,2-b] Thiophenes ($C_n$-DNTTs): Organic Semiconductors for High-Performance Thin-Film Transistors," Adv. Mat., 23(10): 1222-1225 (2011); and co-pending, co-assigned U.S. provisional patent application Ser. No. 61/533,785. Other thienoacene compounds such as dihexyl-substituted dibenzo [d,d']thieno[3,2-b;4,5-b']dithiophene also have been developed as p-type semiconductors. See Miyata et al., "High-performance organic field-effect transistors based on dihexyl-substituted dibenzo[d,d']thieno[3,2-b;4,5-b']dithiophene," J. Mater. Chem. (2012). Another class of small molecule p-type OSCs relates to naphtha[2,1-b:6,5-b']difuran: A Versatile Motif Available for Solution-Processed Single-Crystal Organic Field-Effect Transistors with High Hole Mobility," J. Am. Chem. Soc, 134: 5448-5451 (2012). Yet another class of small molecule p-type OSCs relates to fluorinated anthradithiophene derivatives. See Subramanian et al., "Chromophore Fluorination Enhances Crystallization and Stability of Soluble Anthradithiophene Semiconductors," J. Am. Chem. Soc., 130(9): 2706-2707 (2008).

Recently, 2-(4-hexylphenylvinyl)anthracene has been reported as a p-type semiconductor with strong solid-state blue emission. See Dadvand et al., "Maximizing Field-Effect Mobility and Solid-State Luminescence in Organic Semiconductors," Angew. Chem. Int. Ed., 51: 3837-3841 (2012);

Further exemplary classes of p-type semiconductors include phthalimide-based polymers, certain diketopyrrolopyrrole-based polymers, isoindigo-based conjugated polymers, See International Publication No. WO2010/117449; Li et al., "A High Mobility P-Type DPP-Thieno[3,2-b]thiophene Copolymer for Organic Thin-Film Transistors," Adv. Mater., 22: 4862-4866 (2010), Li et al., "Annealing-Free High-Mobility Diketopyrrolopyrrole-Quaterthiophene Copolymer for Solution-Processed Organic Thin Film Transistors," J. Am. Chem. Soc., 133: 2198-2204 (2011), Bronstein et al., "Thieno [3,2-b]thiophene-Diketopyrrolopyrrole-Containing Polymers for High-Performance Organic Field-Effect Transistors and Organic Photovoltaic Devices," J. Am. Chem. Soc., 133: 3272-3275 (2011) and Chen et al., "Highly pi-Extended Copolymers with Diketopyrrolopyrrole Moieties for High-Performance Field-Effect Transistors," Adv. Mater. (2012); Mei et al., "Siloxane-Terminated Solubilizing Side Chains: Bringing Conjugated Polymer Backbones Closer and Boosting Hole Mobilities in Thin-Film Transistors," J. Am. Chem. Soc., 133: 20130-20133 (2011) and Lei et al., "High-Performance Air-Stable Organic Field-Effect Transistors: Isoindigo-Based Conjugated Polymers," J. Am. Chem. Soc., 133: 6099-6101 (2011).

Other linear acenes, bent acenes, arylvinylenes, phenylenes, and fused (hetero)arenes including those substituted with alkyl and/or alkoxy groups also can be suitable p-type semiconductor materials for use according to the present teachings.

Depending on the light emission type (red, green or blue), the energy of the hole-transporting semiconductor material must match that of the electron transporting semiconductor material. Thus, for red emission, the energy difference between the highest occupied molecular orbital (HOMO) of the hole-transporting semiconductor material and the lowest unoccupied molecular orbital (LUMO) of the electron-transporting semiconductor material should be, at a minimum, between about 1.6V and about 1.8 eV. For green emission, the energy difference between the HOMO of the hole-transporting semiconductor material and the LUMO of the electron-transporting semiconductor material has to be, at a minimum, between about 2.2 eV and about 2.5 eV. For blue emission, the energy difference between the HOMO of the hole-transporting semiconductor material and the LUMO of the electron-transporting semiconductor material has to be, at a minimum, between about 2.8 eV and about 3.2 eV.

In some embodiments, the emissive sublayer can be a blend that includes a host material and a guest emitter selected from a fluorescent emitter and a phosphorescent emitter. In other embodiments, the emissive sublayer can be prepared from a single-component host-emitting material. Suitable organic electroluminescent light-emitting materials include those having been used in OLED applications. In one embodiment, the emissive sublayer can be composed of a blend of host tris(8-hydroxyquinolinato)aluminium ($Alq_3$) and guest 4-(dicyanomethylene)-2-methyl-6-(p-dimethylaminostyryl)-4H-pyran (DCM).

Further examples of host materials, guest emitters, and single-component host-emitting materials are described in Chaskar et al., "Bipolar Host Materials: A Chemical Approach for Highly Efficient Electrophosphorescent Devices," Adv. Mater., 23(34): 3876-3895 (2011); Tao et al., "Organic host materials for phosphorescent organic light-emitting diodes," Chem. Soc. Rev., 40(5): 2943-2970 (2011); Sasabe et al., "Multifunctional Materials in High-Performance OLEDs: Challenges for Solid-State Lighting," Chem. Mater., 23(3): 621-630 (2011); Tsuboi, "Recent advances in white organic light emitting diodes with a single emissive dopant," J. Non-Cryst. Solids, 356(37-40): 1919-1927 (201); Singh et al., "Bio-organic optoelectronic devices using DNA," Adv. Polym. Sci., 223 (Organic Electronics): 189-212 (2010); Kappaun et al., "Phosphorescent organic light-emitting devices: working principle and iridium based emitter materials," Int. J. Mol. Sci., 9(8): 1527-1547 (2008); Tokito et al., "Phosphorescent organic light-emitting devices: triplet energy management," Electrochemistry, 76(1): 24-31 (2008); Chen, "Evolution of Red Organic Light-Emitting Diodes: Materials and Devices," Chem. Mater., 16(23): 4389-4400 (2004); Liu et al., "Polyfluorenes with on-chain metal centers," Adv. Poly. Sci., 212 (Polyfluorenes): 125-144 (2008); Danev et al., "Vacuum deposited polyimide—a perfect matrix for nanocomposite materials," J. Optoelectron. Adv. Mater., 7(3): 1179-1190 (2005); U.S. Pat. No. 5,747,183; U.S. Pat. No. 5,683,823; U.S. Pat. No. 6,626,722; U.S. Pat. No. 7,074,502; U.S. Pat. No. 7,671,241; and U.S. Pat. No. 7,772,762.

Some exemplary host materials include polymers such as poly(p-phenylene vinylene), poly(alkyphenylphenylvinylene), poly(alkyphenylphenylvinylene-co-alkoxyphenylenevinylene), polyfluorene, poly(n-vinylcarbazole), and copolymers thereof. Various carbazole compounds, triphenylamine compounds, including hybrids with oxadiazole or benzimidazole also have been used as host materials. Some exemplary guest emitters (light-emitting dyes or dopants) include fluorescent dyes such as various perylene derivatives, anthracene derivatives, rubrene derivatives, carbazole derivatives, fluorene derivatives, and quinacridone derivatives, and phosphorescent emitters such as various transition metal complexes including Ir, Os, or Pt. Some exemplary host-emitting materials include phosphorescent host-emitting compounds based on carbazole derivatives, fluorene derivatives, or 9-naphthylanthracene derivatives, and fluorescent host-emitting compounds based on organometallic chelates such as tris(8-quinolinol) aluminum complexes.

The hole and electron injection layers can be prepared by self-assembly of thiolates, phosphonates, or aliphatic or aromatic carboxylates; by thermal evaporation of various charge transfer complexes and other heteroaromatic or organometallic complexes; or by thermal evaporation or sputtering of various metal oxides, fluorides, or carbonates. The hole injection layer and the electron injection layer can be made of materials that provide a staircase of electronic levels between the energy level of the hole electrode and the electron electrode, and the energy level required for injection into the hole transport sublayer and the electron transport sublayer, respectively. See e.g., Li et al., "Low operating-voltage and high power-efficiency OLED employing $MoO_3$-doped CuPc as hole injection layer," Displays, 33(1): 17-20 (2012); Wen et al., "Self-assembled of conducting polymeric nanoparticles and its application for OLED hole injection layer," Energy Procedia, 12: 609-614 (2011); Zhang et al., "Role of $Fe_3O_4$ as a p-dopant in improving the hole injection and transport of organic light-emitting devices," IEEE Journal of Quantum Electronics, 47(5): 591-596 (2011); Choo et al., "Luminance and charge transport mechanisms for phosphorescent organic light-emitting devices fabricated utilizing a tris(2-phenylpyridine)iridium-doped N,N'-dicarbazolyl-3,5-benzene emitting layer," Thin Solid Films, 519(15): 5253-5256 (2011); Tao et al., "Odd-even modulation of electrode work function with self-assembled layer: Interplay of energy barrier and tunneling distance on charge injection in organic light-emitting diodes," Organic Electronics, 12(4): 602-608 (2011); Sung et al., "AC Field-Induced Polymer Electroluminescence with Single Wall Carbon Nanotubes," Nano Letters, 11(3): 966-972 (2011); Qiao et al., "Controlling charge balance and exciton recombination by bipolar host in single-layer organic light-emitting diodes," Journal of Applied Physics, 108(3): 034508/1-034508/8 (2011); Khizar-ul-Haq et al., "Blue organic light-emitting diodes with low driving voltage and enhanced power efficiency based on $MoO_3$ as hole injection layer and optimized charge balance," Journal of Non-Crystalline Solids, 356(20-22): 1012-1015 (2010); Qi et al., "Analysis of metal-oxide-based charge generation layers used in stacked organic light-emitting diodes," Journal of Applied Physics, 107(1): 014514/1-014514/8 (201); Huang et al., "Materials and interface engineering in organic light-emitting diodes," Organic Electronics, 243-261 (2010); Helander et al., "Comparison of $Alq_3$/alkali-metal fluoride/Al cathodes for organic electroluminescent devices," Journal of Applied Physics, 104(9): 094510/1-094510/6 (2008); Roy Choudhury et al., "LiF as an n-dopant in tris(8-hydroxyquinoline) aluminum thin films," Advanced Materials, 20(8): 1456-1461 (2008); Vacca et al., "Poly(3,4-ethylenedioxythiophene):poly(4-styrenesulfonate) ratio: Structural, physical and hole injection properties in organic light emitting diodes," Thin Solid Films, 516(12): 4232-4237 (2008); Yang et al., "Improved fabrication process for enhancing light emission in single-layer organic light-emitting devices doped with organic salt," Japanese Journal of Applied Physics, 47(2, Pt. 1): 1101-1103 (2008); Kim et al., "UV-ozone surface treatment of indium-tin-oxide in organic light emitting diodes," Journal of the Korean Physical Society, 50(6): 1858-1861 (2007); Prat et al., "Stable, highly efficient and temperature resistant organic light-emitting devices," Japanese Journal of Applied Physics, Part 1: Regular Papers, Brief Communications & Review Papers," 46(4A): 1727-1730 (2007); Luo et al., "Improving the stability of organic light-emitting devices by using a hole-injection-tunable-anodebuffer-layer," *Journal of Applied Physics*, 101(5): 054512/1-054512/4 (2007); Matsushima et al., "Charge-carrier injection characteristics at organic/organic heterojunction interfaces in organic light-emitting diodes," *Chemical Physics Letters*, 435(4-6): 327-330 (2007); Kim et al., "Controllable work function of Li—Al alloy nanolayers for organic light-emitting devices," *Advanced Engineering Materials*, 7(11): 1023-1027 (2005); Kato, "Designing Interfaces That Function to Facilitate Charge Injection in Organic Light-Emitting Diodes," *Journal of the American Chemical Society*, 127(33): 11538-11539 (2005); Veinot et al., "Toward the Ideal Organic Light-Emitting Diode. The Versatility and Utility of Interfacial Tailoring by Cross-Linked Siloxane Interlayers," *Accounts of Chemical Research*, 38(8): 632-643 (2005); Oyamada et al., "Extremely low-voltage driving of organic light-emitting diodes with a Cs-doped phenyldipyrenylphosphine oxide layer as an electron-injection layer," *Applied Physics Letters*, 86(3): 033503/1-033503/3 (2005); Hughes et al., "Electron-transporting materials for organic electroluminescent and electrophosphorescent devices," *Journal of Materials Chemistry*, 15(1): 94-107 (2005); D'Andrade et al., "Efficient organic electrophosphorescent white-light-emitting device with a triple doped emissive layer," *Advanced Materials*, 16(7): 624-628 (2004); Kanno et al., "Development of OLED with high stability and luminance efficiency by co-doping methods for full color displays," *IEEE Journal of Selected Topics in Quantum Electronics*, 10(1): 30-36 (2004); Han et al., "Transparent-cathode for top-emission organic light-emitting diodes,"*Applied Physics Letters*, 82(16): 2715-2717 (2003); Tutis et al., "Internal electric field and charge distribution in multilayer organic light-emitting diodes," *Journal of Applied Physics*, 93(8): 4594-4602 (2003); Mathai et al., "Controlled injection of holes into AlQ3 based OLEDs by means of an oxidized transport layer," *Materials Research Society Symposium Proceedings*, 708 (Organic Optoelectronic Materials, Processing and Devices): 101-106 (2002); Crone et al., "Charge injection and transport in single-layer organic light-emitting diodes," *Applied Physics Letters*, 73(21): 3162-3164 (1998); and Park et al., "Charge injection and photooxidation of single conjugated polymer molecules," *Journal of the American Chemical Society*, 126(13): 4116-7 (2004).

The present OLETs can be operated by applying a first appropriate bias voltage to the gate electrode, and injecting electrons from the electron electrode and holes from the hole electrode, while maintaining a second bias voltage between the latter two electrodes. The first and second bias voltages can be continuous voltages. Alternatively, the first and second bias voltages also can be pulsed voltages.

A plurality of OLETs according to the present teachings can be arranged in a matrix to provide a display device. The display device can include optional driving and switching elements, compensating transistor elements, capacitors, and/or light-emitting diodes.

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A light-emitting transistor device comprising:
   a substrate;
   a gate electrode;
   a channel layer comprising one or more organic sublayers, the one or more organic sublayers comprising:
      a first sublayer comprising an electron-transporting semiconductor material,
      a second sublayer comprising a hole-transporting semiconductor material, and
      a third sublayer comprising an electroluminescent semiconductor material and positioned between the first sublayer and the second sublayer;
   a gate insulating layer positioned between the gate electrode and the channel layer; and
   a hole electrode and an electron electrode being spaced apart from each other at a planar distance defining the length (L) of a channel region therebetween, the hole electrode being in contact with the second sublayer of the channel layer and the electron electrode being in contact with the first sublayer of the channel layer;
   wherein the channel layer further comprises a first electrically insulating element positioned between the hole electrode and the first sublayer of the channel layer, and a second electrically insulating element between the electron electrode and the second sublayer of the channel layer, wherein the first electrically insulating element and the second electrically insulating element are non-overlapping with and nonplanar to each other and individually and in combination do not extend the entire length of the channel region.

2. The device of claim 1, wherein the first electrically insulating element and/or the second electrically insulating element are in contact with the third sublayer.

3. The device of claim 1, wherein the first electrically insulating element is positioned at an interface between the second sublayer and the third sublayer, and the second electrically insulating element is positioned at an interface between the first sublayer and the third sublayer.

4. The device of claim 1, further comprising an electron-injection layer deposited between the electron-transporting semiconductor material and the electron electrode.

5. The device of claim 1, further comprising a hole-injection layer deposited between the hole-transporting semiconductor material and the hole electrode.

6. The device of claim 1, further comprising a passivation layer covering a top surface of the channel layer.

7. The device of claim 1, wherein the substrate comprises a surface-modifying material deposited on a surface of the substrate.

8. The device of claim 1, wherein the gate electrode comprises a length ($L_G$) that is identical to L, and wherein the edges of the gate electrode are aligned with an edge of the hole electrode and an edge of the electron electrode.

9. The device of claim 1, wherein the gate electrode comprises a length ($L_G$) that is greater than L, and wherein at least one edge of the gate electrode overlaps with one of the hole electrode and the electron electrode.

10. An optoelectronic device for producing an image, wherein the optoelectronic device comprises a plurality of identical or different light-emitting transistor devices according to claim 1 interconnected to each other and deposited on a substrate.

* * * * *